United States Patent
Tada et al.

(10) Patent No.: US 11,081,639 B2
(45) Date of Patent: Aug. 3, 2021

(54) PIEZOELECTRIC ELEMENT MANUFACTURING METHOD

(71) Applicant: KONICA MINOLTA, INC., Tokyo (JP)

(72) Inventors: Kazunari Tada, Tokyo (JP); Naoki Shimizu, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 212 days.

(21) Appl. No.: 16/302,817

(22) PCT Filed: Apr. 25, 2017

(86) PCT No.: PCT/JP2017/016309
§ 371 (c)(1),
(2) Date: Nov. 19, 2018

(87) PCT Pub. No.: WO2017/199705
PCT Pub. Date: Nov. 23, 2017

(65) Prior Publication Data
US 2019/0305209 A1    Oct. 3, 2019

(30) Foreign Application Priority Data

May 19, 2016 (JP) .............................. JP2016-100335
Jan. 23, 2017 (JP) .............................. JP2017-009392

(51) Int. Cl.
*H04R 17/00* (2006.01)
*H01L 41/338* (2013.01)
(Continued)

(52) U.S. Cl.
CPC .......... *H01L 41/338* (2013.01); *H01L 21/306* (2013.01); *H01L 21/308* (2013.01);
(Continued)

(58) Field of Classification Search
CPC ..... H01L 41/18; H01L 41/183; H01L 41/332; H01L 41/338; H01L 41/37; H01L 21/306; H01L 21/308
See application file for complete search history.

(56) References Cited

U.S. PATENT DOCUMENTS

2007/0267947 A1   11/2007   Matsushita et al.
2010/0198077 A1*   8/2010   Ooura ................... A61B 8/463
                                                          600/459
(Continued)

FOREIGN PATENT DOCUMENTS

JP   2005064065 A   3/2005
JP   2005139064 A   6/2005
(Continued)

OTHER PUBLICATIONS

PCT International Preliminary Report on Patentability with Written Opinion of the International Searching Authority corresponding to Application No. PCT/JP2017/016309; dated Nov. 20, 2018.
(Continued)

*Primary Examiner* — Paul D Kim
(74) *Attorney, Agent, or Firm* — Cantor Colburn LLP

(57) ABSTRACT

The present invention provides a piezoelectric element manufacturing method. The manufacturing method is a method of manufacturing a piezoelectric element comprising a piezoelectric body composite in which a piezoelectric body configured from a Pb-based piezoelectric material and a resin are alternately arranged, and comprises a step of etching, using an etching liquid, a plurality of parallel piezoelectric body segments formed by dicing. The etching liquid comprises a liquid which contains 0.1 to 20 mass % of hexafluorosilicic acid.

13 Claims, 11 Drawing Sheets

(51) Int. Cl.
   *H01L 41/18* (2006.01)
   *H01L 41/332* (2013.01)
   *H01L 21/306* (2006.01)
   *H01L 21/308* (2006.01)

(52) U.S. Cl.
   CPC ............ *H01L 41/18* (2013.01); *H01L 41/183* (2013.01); *H01L 41/332* (2013.01)

(56) References Cited

U.S. PATENT DOCUMENTS

| | | | | |
|---|---|---|---|---|
| 2014/0202629 A1* | 7/2014 | Uetani | .................... | C04B 41/81 156/268 |
| 2014/0221841 A1* | 8/2014 | Okuda | .................. | B06B 1/0677 600/459 |

FOREIGN PATENT DOCUMENTS

| | | | |
|---|---|---|---|
| JP | 2010147088 A | 7/2010 |
| JP | 2012182758 A | 9/2012 |
| JP | 2016040798 A | 3/2016 |

OTHER PUBLICATIONS

International Search Report corresponding to Application No. PCT/JP2017/016309; dated Jul. 4, 2017.
JPO Notice of Reasons for Refusal for corresponding JP Application No. 2018-518186; dated Jun. 1, 2021.

\* cited by examiner

PIEZOELECTRIC ELEMENT MANUFACTURING METHOD

CROSS REFERENCE TO RELATED APPLICATIONS

This is the U.S. national stage of application No. PCT/JP2017/016309, filed on Apr. 25, 2017. Priority under 35 U.S.C. § 119(a) and 35 U.S.C. § 365(b) is claimed from Japanese Application No. 2017-009392, filed on Jan. 23, 2017 and Japanese Application No. 2016-100335, filed on May 19, 2016, the disclosure of which is also incorporated herein by reference.

TECHNICAL FIELD

The present invention relates to a method for producing a piezoelectric element.

BACKGROUND ART

In recent years, piezoelectric elements having high performance have been actively developed. As one of such piezoelectric elements, a piezoelectric element having a piezoelectric member (hereinafter occasionally referred to as "piezoelectric composite") having piezoelectric bodies and resinous bodies alternately arranged is commonly known. A known method for precisely controlling the size of such a piezoelectric composite is one that includes etching a piezoelectric base made of a Pb-based piezoelectric material with an etchant to form piezoelectric segments and that uses as the etchant a liquid containing nitric acid and ammonium fluoride (see PTL 1, for example).

CITATION LIST

Non-Patent Literature

PTL 1 Japanese Patent Application Laid-Open No. 2010-147088

SUMMARY OF INVENTION

Technical Problem

However, the above conventional method may fail to uniformly etch the plurality of piezoelectric segments arranged densely in the piezoelectric base and result in tapering of the piezoelectric segments or a difference in the amount of etching between piezoelectric segments located at the edge of the piezoelectric base and piezoelectric segments located at the center of the piezoelectric base. With such a difference, only limited portions of the piezoelectric segments can be used in piezoelectric composites, which leads to reduced efficiency of production of the piezoelectric composites. Thus, concerning precise size control by etching of piezoelectric segments, there remains room to make an investigation in terms of uniform etching of the entire piezoelectric segments to be processed.

It is an object of the present invention to provide a method that allows uniform etching of a plurality of piezoelectric segments.

Solution to Problem

To achieve the above objects, a method for producing a piezoelectric element reflecting an aspect of the present invention includes a piezoelectric composite, the piezoelectric composite having piezoelectric bodies made of a Pb-based piezoelectric material and resinous bodies alternately arranged, the method including: etching a plurality of aligned piezoelectric segments formed by dicing with an etchant, in which a liquid containing 0.1 to 20 mass % of hexafluorosilicic acid is used as the etchant.

DESCRIPTION OF EMBODIMENTS

Figure 1A:
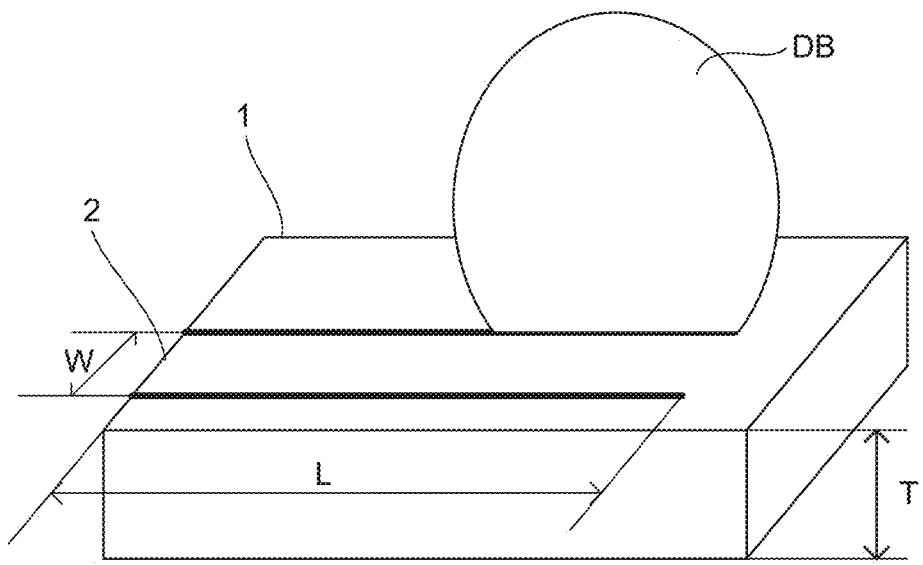
FIG. 1A is a diagram illustrating the length, thickness, and width of a piezoelectric segment, and FIG. 1B schematically shows an example of a taper formed by dicing of a piezoelectric base.

Hereinafter, an embodiment of the present invention will be described.

[Method for Producing Piezoelectric Thin Film]

A method for producing a piezoelectric element according to the present embodiment is a method for producing a piezoelectric element including a piezoelectric composite having piezoelectric bodies made of a lead (Pb)-based piezoelectric material and resinous bodies alternately arranged.

A "piezoelectric composite having piezoelectric bodies and resinous bodies alternately arranged" has a structure in which the piezoelectric bodies are regularly arranged in at least one direction and the gaps between the piezoelectric bodies are filled with the resinous bodies. Examples of the structure of the piezoelectric composite include: a structure constituted by plate-shaped piezoelectric bodies arranged at constant intervals in one direction and resinous bodies filling the gaps between the piezoelectric bodies; and a structure constituted by pillar-shaped piezoelectric bodies arranged at constant intervals in two orthogonal directions and resinous bodies filling the gaps between the piezoelectric bodies.

The piezoelectric body can be selected as appropriate to the extent that the piezoelectric composite can be configured. For example, the piezoelectric body used may be a piezoelectric body made of a Pb-based piezoelectric material. The Pb-based piezoelectric material is a piezoelectric material having a crystal lattice containing lead (Pb) and is, for example, a Pb-based metal oxide with a perovskite structure. Examples of the Pb-based piezoelectric material include lead zirconate titanate (PZT), lead magnesium niobate-lead titanate (PMN-PT), lead zing niobate-lead titanate (PZN-PT), lead scandium niobate-lead titanate (PSN-PT), lead indium niobate-lead titanate (PIN-PT), and lead indium niobate-lead magnesium niobate-lead titanate (PIN-PMN-PT).

The resinous bodies fix the piezoelectric bodies at particular intervals. For the resinous bodies, a known resin for use in fixing piezoelectric bodies in piezoelectric elements can be used. Examples of the resin include an epoxy resin, a UV-curable resin, and a thermosetting resin. The epoxy resin may be a two-component epoxy resin, examples of which include: C-1001A/B and C-1163A/B (both of which are available from TESK CO., LTD.); EP007 (available from CEMEDINE CO., LTD.); EP2240 (available from Evonik Japan); and JER828 (available from Mitsubishi Chemical Corporation).

The above production method includes an etching. This etching is an etching of a plurality of aligned piezoelectric segments formed by dicing with an etchant.

The piezoelectric segments are shaped according to the intended shape of the piezoelectric bodies in the piezoelectric element. The piezoelectric segments are, for example, plate-shaped or pillar-shaped.

The piezoelectric segments are obtained by cutting a piezoelectric base by dicing. The piezoelectric segments may be cut out separately from each other. In order to enable easy handling of the piezoelectric segments, all of the plurality of aligned piezoelectric segments are integrally connected to the piezoelectric base. Such a set of piezoelectric segments can be obtained by dicing in which the piezoelectric base is cut in a depth direction so as to form the piezoelectric segments.

In the case of the plate-shaped piezoelectric segments, the length of the piezoelectric segments can be determined by the length of cuts made by dicing, and this length is represented, for example, by L in FIG. 1A. From the viewpoint of production efficiency, the length of the piezoelectric segments is preferably 1 to 50 mm and more preferably 10 to 30 mm.

In the case of the plate-shaped piezoelectric segments, the thickness of the piezoelectric segments is a dimension corresponding to the thickness of the piezoelectric composite and is represented, for example, by T in FIG. 1A. The thickness T of the piezoelectric segments can be determined by the design value of the thickness of the piezoelectric composite and can be adjusted, for example, depending on the size (thickness) of the piezoelectric base and the amount of etching. The thickness of the piezoelectric composite formed from the plate-shaped piezoelectric segments can be eventually adjusted by polishing. Thus, it is sufficient for the dimension (thickness) T of the piezoelectric segments to be greater than the intended thickness of the piezoelectric composite. The thickness T of the piezoelectric segments is preferably 10 to 700 µm, more preferably 60 to 500 µm, and even more preferably 80 to 300 µm.

In the case of the plate-shaped piezoelectric segments, the width of the piezoelectric segments is a dimension in a direction in which the piezoelectric segments are aligned in the piezoelectric composite. The width of the plate-shaped piezoelectric segments is represented, for example, by W in FIG. 1A. The width of the piezoelectric segments can be determined by the intervals (pitches) between cuts made by dicing and can be adjusted, for example, depending on the amount of etching. For example, the width of the piezoelectric segments before etching is greater than the intended width of the piezoelectric bodies in the piezoelectric element by an amount (amount of etching) corresponding to a depth to which the piezoelectric segments are dissolved by etching. In order to achieve dense arrangement of the piezoelectric bodies in the piezoelectric composite and ensure high production efficiency, the width W of the plate-shaped piezoelectric segments after etching is preferably 5 to 30 µm and more preferably 8 to 15 µm.

Figure 5:
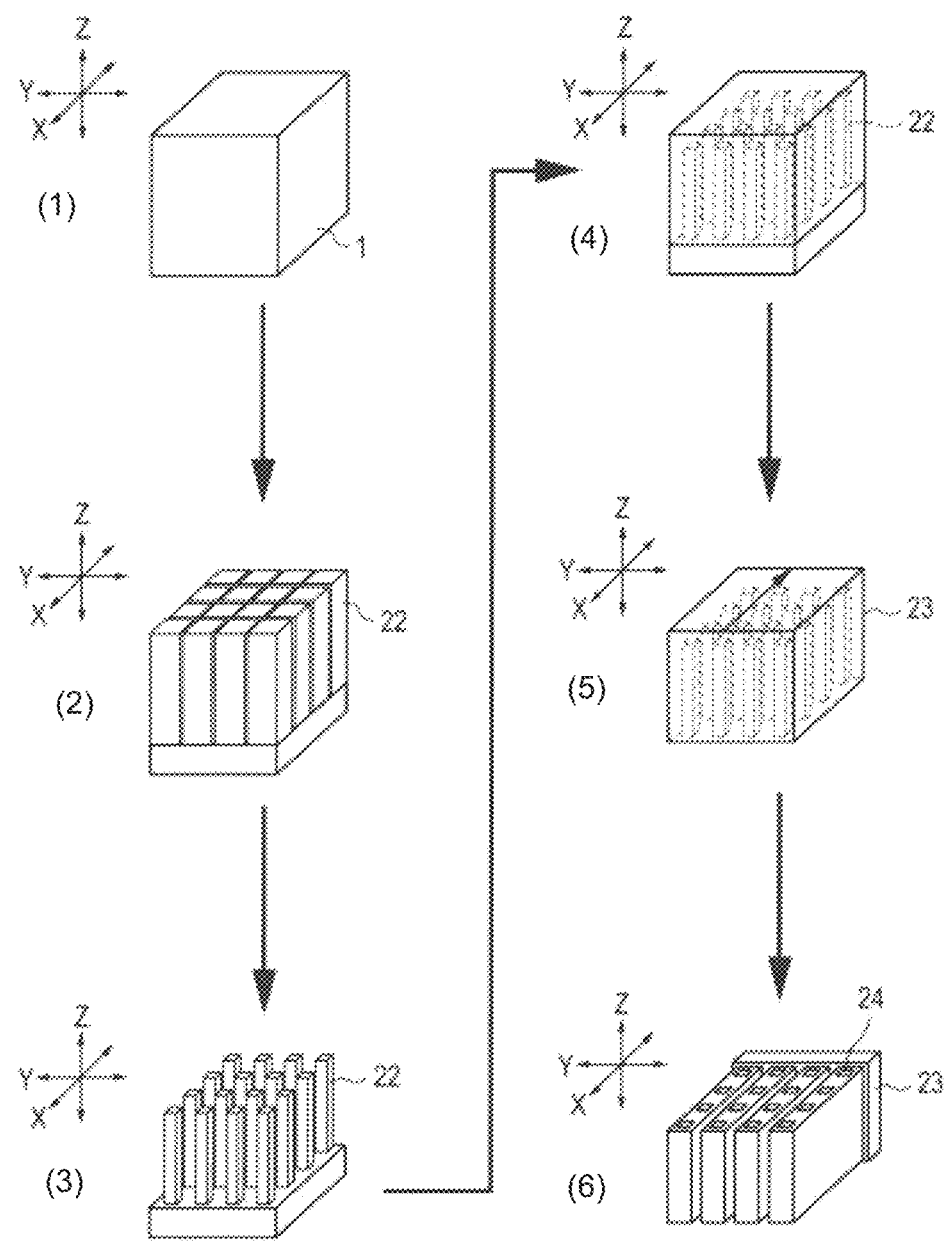
FIG. 5 schematically illustrates the early stage of an exemplary process of producing a piezoelectric element having pillar-shaped piezoelectric bodies from a piezoelectric substrate according to an embodiment of the present invention.

In the case of the pillar-shaped piezoelectric segments, the length of the piezoelectric segments is defined by a dimension in the Z direction in FIG. 5 and can be determined, for example, by the depth of cuts made by dicing. The thickness of the piezoelectric composite formed from the pillar-shaped piezoelectric segments can be eventually adjusted by polishing. Thus, it is sufficient for the length of the piezoelectric segments to be greater than the intended thickness of the piezoelectric composite. In order to prevent fracture of the piezoelectric segments and ensure high production efficiency, the length of the pillar-shaped piezoelectric segments is preferably 10 to 1,000 µm, more preferably 50 to 500 µm, and even more preferably 80 to 300 µm.

In the case of the pillar-shaped piezoelectric segments, the width of the piezoelectric segments is defined by two dimensions extending in the directions X and Y in FIG. 5. Like the width of the plate-shaped piezoelectric segments, the width of the pillar-shaped piezoelectric segments can be determined by the intervals (pitches) between cuts made by dicing and can be adjusted, for example, depending on the amount of etching. In order to achieve dense arrangement of the piezoelectric bodies in the piezoelectric composite and ensure high production efficiency, the width of the pillar-shaped piezoelectric segments after etching is preferably 5 to 30 µm and more preferably 8 to 15 µm.

The cross-section of the "pillar-shaped" piezoelectric segments (bodies) is typically rectangular and may be square-shaped or rectangle-shaped. The aspect ratio of the cross-sectional shape is preferably 1:7 to 1:1 and more preferably 1:3 to 1:1.

The piezoelectric segments can be obtained by cutting a piezoelectric base by dicing. The piezoelectric segments may be cut out separately from each other. In order to enable ease handling of the piezoelectric segments, all of the aligned piezoelectric segments are integrally connected to the piezoelectric base. Such a set of piezoelectric segments can be obtained by dicing in which the piezoelectric base is cut in a depth direction so as to form the piezoelectric segments.

The etchant can be selected as appropriate to the extent that the etchant is usable for wet etching of the piezoelectric bodies. The etchant used can be, for example, a liquid containing hexafluorosilicic acid. The concentration of the etchant can be determined as appropriate depending on the size of the piezoelectric segments before and after the etching or on the desired etching rate.

For example, the etchant contains 0.1 to 20 mass % of hexafluorosilicic acid. The remainder of the etchant typically consists of water. Hexafluorosilicic acid acts mainly to uniformize the etching rate among the plurality of piezoelectric segments.

If the content of hexafluorosilicic acid in the etchant is less than 0.1 mass %, the effect on uniformization of the etching rate among the piezoelectric segments may be insufficient, while if the content is more than 20 mass %, a slow etching rate may lead to a decrease in the efficiency of production of the piezoelectric element. From the viewpoint of uniformization of the etching rate, the content of hexafluorosilicic acid in the etchant is preferably 0.1 mass % or more and more preferably 10 mass % or more. From the viewpoint of the efficiency of production of the piezoelectric element, the content of hexafluorosilicic acid in the etchant is preferably 5 mass % or less and more preferably 3 mass % or less.

The etchant may further contain additional components other than hexafluorosilicic acid to the extent that the effect of the present embodiment is obtained. For example, the etchant may further contain one or more compounds selected from the group consisting of nitric acid, ammonium fluoride, and sodium fluoride in order to promote the etching (such a compound may be referred to as "etching promoter" hereinafter), provided that the content of each compound contained is 1 to 10 mass %. The etching promoter may consist of one of the compounds of the group or include two or more of the compounds.

In the etchant, the content of each compound of the etching promoter group is, for example, 1 to 10 mass %. When the etching promoter consists of one of the compounds of the group, the content of the etching promoter is 1 to 10 mass %. When the etching promoter includes all of the three compounds of the group, the content of the etching promoter is 3 to 30 mass % in total.

If the content of each compound as the etching promoter is less than 1 mass %, the etching rate may be so low that the efficiency of production of the piezoelectric element decreases. If the content of each compound as the etching promoter is more than 10 mass %, the degree to which the etching advances may be uneven among the plurality of piezoelectric segments. In order to achieve appropriate promotion of the etching, the content of each compound as the etching promoter is preferably 1 mass % or more and more preferably 3 mass % or more. In order to appropriately reduce the unevenness in the amount of etching, the content of each compound as the etching promoter in the etchant is preferably 10 mass % or less and more preferably 6 mass % or less.

If the ratio of the content of hexafluorosilicic acid to the content of the etching promoter in the etchant is excessively low, the effect of hexafluorosilicic acid on uniformization of the etching rate may be insufficient. If the content ratio is excessively high, the etching promoting effect of the etching promoter may be insufficient. In order to allow both hexafluorosilicic acid and the etching promoter to exhibit their effects sufficiently, the content ratio is preferably 0.01 to 1 and more preferably 0.1 to 0.5.

Examples of the additional components other than the etching promoter in the etchant include a surfactant.

The etching can be accomplished by ensuring sufficient contact of the surface of the piezoelectric segments with the etchant. For example, the etching can be accomplished by immersing the piezoelectric segments in the etchant stirred properly. "Proper stirring" refers, for example, to stirring performed at a stirring rate sufficient to prevent the flow of the etchant from becoming stagnant in the vicinity of the surface of the piezoelectric segments (allow the etchant to be continuously supplied to the surface of the piezoelectric segments).

If the etching rate in the etching is excessively high, the degree to which the etching advances may be non-uniform among the plurality of piezoelectric segments. In order to achieve uniform etching of the piezoelectric segments, the etching rate is preferably less than 2 μm/min. The lower limit of the etching rate can be set from the viewpoint of the efficiency of production of the piezoelectric element. From such a viewpoint, the etching rate is preferably 0.2 μm/min or more.

The etching rate can be adjusted depending on the content of the etching promoter in the etchant. For example, increasing the content of the etching promoter can increase the etching rate.

The etching rate can be adjusted depending on the temperature of the etchant. For example, increasing the temperature of the etchant can increase the etching rate. The temperature of the etchant is preferably 35° C. or lower in order to achieve an etching rate as defined above (1 μm/min). The lower limit of the temperature of the etchant may be in a temperature range where the etchant can maintain a liquid state. In order to simplify the temperature control, the temperature of the etchant may be an ordinary temperature (25° C., for example).

Further, the etching rate can be adjusted depending on whether the etchant is stirred or depending on the stirring rate. For example, increasing the intensity of stirring of the etchant can increase the etching rate. As described above, the etchant may be stirred at a stirring rate which is sufficient to prevent the flow of the etchant from becoming stagnant in the vicinity of the surface of the piezoelectric segments and which is moderate enough not to cause fracture of the piezoelectric segments during the etching. For example, when the etching is carried out with an etchant contained in a 50 mL tall beaker, the etchant can be stirred with a magnetic stirrer at 200 to 300 rpm.

The etching is suitable for precise control of the shape and arrangement of the piezoelectric bodies. For example, the etching is suitable for formation of piezoelectric segments having a width of 30 μm or less and a thickness of 80 μm or more.

The dicing may cause the piezoelectric segment to have a taper extending in a direction from a first end of the piezoelectric segment to a second end of the piezoelectric segment, the second end being opposite to the first end. The direction of the taper is not limited. The taper may be a double taper or single taper. The taper may be formed to extend over the entire distance from the first end to the second end or may be formed only in a region near the second end of the piezoelectric segment.

Figure 1B:
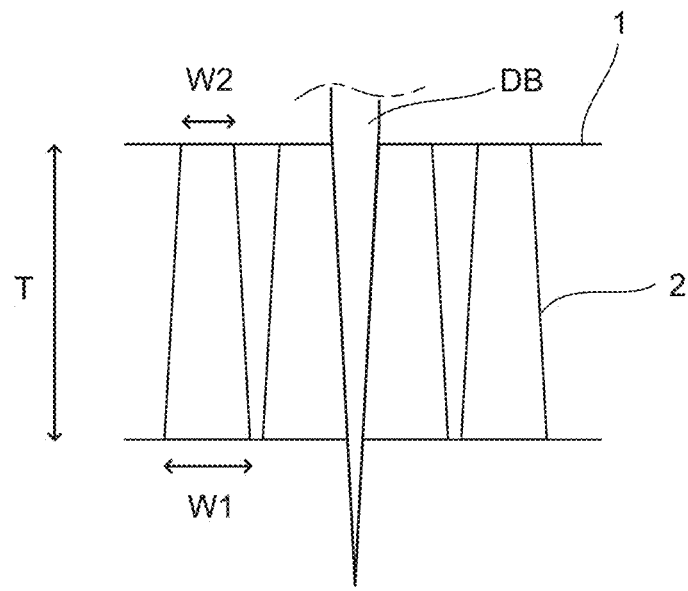

For the dicing, a dicer blade (dicing blade) DB which is a blade for cutting can be used as shown in FIG. 1A. The dicer blade DB has a taper toward the front edge of the dicer blade DB in order to, for example, prevent damage to piezoelectric segment 2 formed by the dicing. Thus, in the dicing using such a dicer blade DB, the shape of the taper of the dicer blade DB is transferred to a cut in the piezoelectric base 1, namely to the cut surface of piezoelectric segment 2, as shown in FIG. 1B.

Thus, the two end surfaces of each piezoelectric segment 2 that are opposite to each other in the direction in which piezoelectric segments 2 are aligned have a taper extending in a direction from the front edge of the dicer blade DB (the first end) toward the center of the dicer blade DB (the second end). Thus, the width of piezoelectric segment 2 on one of two end surfaces opposite to each other in the direction of cutting by dicing (the thickness direction of the piezoelectric base 1) is W1, while the width of piezoelectric segment 2 on the other of the two end surfaces is W2 smaller than W1. The amount of tapering is such that when, for example, W1 is about 51 µm, W2 is about 50 µm.

The etching may be an etching of a plurality of piezoelectric segments in an etchant, with the piezoelectric segments being aligned at intervals and being tapered in a direction from the first end edge to the second end edge. Such an etching may include a first etching and second etching which will be described later. These etchings can be accomplished using a known technique for wet etching of piezoelectric bodies.

The order and number of repetitions of the first etching and second etching can be determined as appropriate to the extent that the effect of the present embodiment is obtained. For example, the first etching may precede the second etching or the second etching may precede the first etching. The two steps may be alternately repeated or may be repeated in a random order.

The first etching is an etching of the plurality of piezoelectric segments by causing the etchant to flow relative to the piezoelectric segments in such a manner that the concentration of the etchant is constant between the first ends and second ends of the piezoelectric segments. Saying that the concentration of the etchant is "constant" means that the concentration is constant enough (substantially constant) to allow the etching of the piezoelectric segments to advance uniformly in the first etching.

The first etching can be accomplished by ensuring sufficient contact of the surface of the piezoelectric segments with the etchant. Through this first etching, the piezoelectric segments are etched substantially uniformly at their sections which are in contact with the etchant. The total time of the first etching can be determined as appropriate depending on the desired thickness of the piezoelectric segments.

The concentration of the etchant refers to the concentration of an active component in the etchant. The active component is a component acting to dissolve the piezoelectric segments and may, for example, be hexafluorosilicic acid described above or the etching promoter described above or include both hexafluorosilicic and the etching promoter.

For example, the first etching can be accomplished by immersing the piezoelectric segments in the etchant stirred properly. "Proper stirring" refers, for example, to stirring performed at a stirring rate sufficient to prevent the flow of the etchant from becoming stagnant in the vicinity of the surface of the piezoelectric segments (allow the etchant to be continuously supplied to the surface of the piezoelectric segments).

In this first etching, it is preferable to cause the etchant to flow in such a direction that the etchant passes through gaps between the plurality of piezoelectric segments without being blocked by the piezoelectric segments. This allows the etchant contacting the surface of the piezoelectric segments to be constantly replaced by the stirring-induced flow, consequently making the concentration of the surface-contacting etchant substantially constant between the first ends and second ends of the piezoelectric segments.

Alternatively, the first etching can be accomplished by shaking the piezoelectric segments in the etchant. In such a first etching, the concentration of the etchant contacting the surface of the piezoelectric segments can be made substantially constant between the first ends and second ends of the piezoelectric segments. In this first etching, the rate at which the piezoelectric segments are shaken can be determined as appropriate to the extent that the etchant contacting that portion of the surface of the piezoelectric segments which is immersed in the etchant is replaced on and around the surface and that stirring- or shaking-induced damage to the piezoelectric segments is avoided.

If the etching rate in the first etching is excessively high, the degree to which the etching advances may be non-uniform among the plurality of piezoelectric segments. In order to achieve uniform etching of the piezoelectric segments, the etching rate is preferably less than 2 µm/min. The lower limit of the etching rate can be determined from the viewpoint of the efficiency of production of the piezoelectric element. From such a viewpoint, the etching rate is preferably 0.2 µm/min or more.

The second etching is an etching of the plurality of piezoelectric segments under a condition where the concentration of the etchant is higher around the first ends (the starting points of the tapers) than around the second ends (the extreme ends of the tapers) of the piezoelectric segments. Saying that the concentration of the etchant is "higher" means that the concentration of the etchant around the first ends is higher (substantially higher) than that around the second ends by an amount large enough to allow the etching of the piezoelectric segments in the second etching to advance at a sufficiently higher rate on the first ends than on the second ends.

The condition where the concentration of the etchant is higher around the first ends than around the second ends can be satisfied, for example, by: (1) rendering the stirring rate of the etchant higher around the first ends than around the second ends; (2) using an etching bath shaped in such a manner that when the piezoelectric segments are placed in the etching bath, the volume of the etching bath is smaller around the first ends than around the second ends; (3) the piezoelectric segments are placed on a supporting section in the etchant in such a manner that the second ends of the piezoelectric segments are in contact with the supporting section; (4) placing the piezoelectric segments in the etchant in such a manner that the direction in which the piezoelectric segments are aligned coincides with the flow direction of the etchant; or combining two or more of these methods (1) to (4).

The etchant is consumed in dissolution of the piezoelectric segments. With the method (1), the etchant present in the vicinity of the surface of the piezoelectric segments, whose active component has been used in the etching and whose effective concentration has been reduced, is replaced more quickly around the first ends of the piezoelectric segments than around the second ends. Thus, the concentration of the etchant becomes higher around the first ends than around the second ends.

With the method (2), the stirring-induced flow or naturally-occurring flow of the etchant in the etching bath is weaker around the second ends than around the first ends of the piezoelectric segments. Thus, the etchant whose active component has been used in the etching and whose effective concentration has been reduced is more likely to become stagnant around the second ends than around the first ends, in consequence of which the concentration of the etchant becomes higher around the first ends than around the second ends.

With the method (3) or (4), the etchant whose active component has been used in the etching and whose effective concentration has been reduced becomes stagnant in the gaps between the piezoelectric segments around the second ends of the piezoelectric segments. Thus, the concentration of the etchant becomes higher around the first ends than around the second ends.

The supporting section can be selected as appropriate to the extent that the supporting section has a surface on which the piezoelectric segments can be placed in such a manner that the second ends of the piezoelectric segment are in contact with the surface. For example, the supporting section may be a portion of the bottom of the etching bath such as the tall beaker as mentioned above, a portion of the side wall of the etching bath, or a portion other than the etching bath, such as a flat plate placed in the etchant. All of the piezoelectric segments may be in contact with the supporting section at their second ends, or only the second ends of some of the piezoelectric segments may be in contact with the supporting section, or only part of the second ends may be in contact with the supporting section.

The material of the supporting section is not limited. In order to render the concentration of the etchant higher around the first ends than around the second ends of the piezoelectric segments, the supporting section is more preferably composed of a material dissolvable by the etchant. When the second ends of the piezoelectric segment are in contact with the supporting section made of such a dissolvable material, the active component of the etchant around the second ends of the piezoelectric segments is consumed not only in dissolution of the piezoelectric segments but also in dissolution of the supporting section, and the etchant whose active component has thus been consumed becomes stagnant around the second ends of the piezoelectric segments. Thus, the concentration of the etchant around the second ends of the piezoelectric segments can be further lowered as compared to that around the first ends. Examples of the material of the supporting section include inorganic oxide materials such as glass.

The concentration, temperature, and stirring rate of the etchant in the second etching can be determined as appropriate and may be, for example, the same or different from those in the first etching. During the second etching, the concentration, temperature, and stirring rate of the etchant may be constant or may be varied as appropriate.

The production method may further include steps other than the etchings to the extent that the effect of the present embodiment is obtained. For example, the production method may further include other steps appropriate for achieving the desired shape of the piezoelectric bodies in the piezoelectric element.

For example, in the case where the piezoelectric segments are plate-shaped, the production method may further include: a gap-adjusting of adjusting the intervals between adjacent of the etched piezoelectric segments to constant intervals; and a resin filling in which a resin is filled the gaps between the piezoelectric segments with after the adjustment of the intervals.

The gap-adjusting can be accomplished by using a known technique for adjusting the intervals between piezoelectric bodies in production of piezoelectric elements. For example, the gap-adjusting can be accomplished by immersing the set of piezoelectric segments subjected to the etching in a slurry of resin particles of uniform particle size and then withdrawing the set of piezoelectric segments from the slurry. With such a method, the resin particles are placed between the piezoelectric segments in such a manner that the resin particles are held by the adjacent piezoelectric segments, and the intervals between the adjacent piezoelectric segments are adjusted to intervals equal to the particle size of the resin particles.

If the adjusted distances are excessively small, the adjacent piezoelectric bodies may interfere with each other in the piezoelectric element, while if the adjusted intervals are excessively large, the intended piezoelectric properties owing to dense arrangement of the piezoelectric bodies may not be obtained. From these viewpoints, the distances are preferably 0.3 to 2 times larger than the width of the etched piezoelectric segments.

The resin filling can be accomplished by introducing a liquid resin into the gaps between the piezoelectric segments by capillary action after the adjustment of the intervals between the piezoelectric segments.

Depending on the viscosity of the liquid resin, the gap-adjusting and the resin filling can be accomplished at the same time. Such a method can be carried out, for example, by immersing the set of piezoelectric segments in a liquid resin having a particular viscosity and then withdrawing the set of piezoelectric elements from the liquid resin. In this method, the amount of the resin to be deposited the surface of the piezoelectric segments depends on the viscosity. For example, increasing the viscosity of the liquid resin can increase the amount of the resin to be deposited on the surface of the piezoelectric segment (the resin is deposited to a greater thickness on the surface). Thus, the gaps between the adjacent piezoelectric segments are filled with the resin, and the intervals between the piezoelectric segments are adjusted to particular intervals defined by the amount of the deposited resin.

Figure 2:
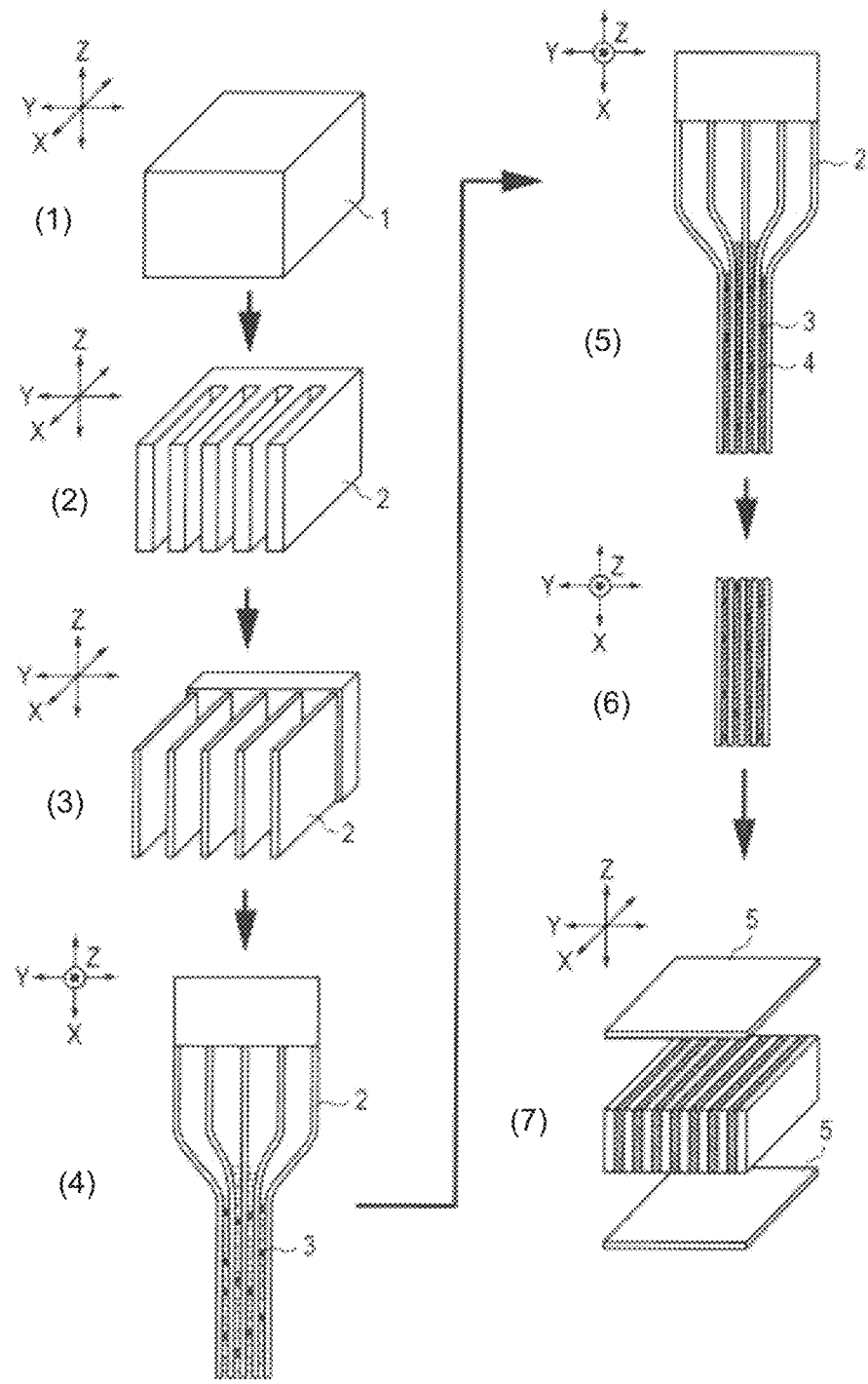
FIG. 2 schematically illustrates an exemplary process of producing a piezoelectric element having plate-shaped piezoelectric bodies from a piezoelectric substrate according to an embodiment of the present invention.

FIG. 2 schematically illustrates an exemplary process of producing a piezoelectric element having plate-shaped piezoelectric bodies from a piezoelectric substrate.

A piezoelectric substrate (for example, a PMN-PT substrate) 1 is cut by dicing in the X direction. This results in formation of a plurality of plate-shaped piezoelectric segments 2 each having a long side extending in the X direction, a short side extending in the Z direction (the thickness direction of a piezoelectric composite to be produced), and a thickness extending tin the Y direction (the direction of the width of each piezoelectric body in the piezoelectric composite). For the plate-shaped piezoelectric segments 2, the length means a dimension in the X direction, the thickness means a dimension in the Z direction, and the width means a dimension in the Y direction. The cuts formed by dicing extend through piezoelectric substrate 1 except for an end in the X direction, and all of piezoelectric segments 2 are connected at their ends in the X direction to the edge of piezoelectric substrate 1. The X, Y, and Z directions are orthogonal to each other as shown in the figure.

Piezoelectric segments 2 are etched with the etchant as previously described. As a result of this etching, all of piezoelectric segments 2 are etched substantially uniformly and shaped to have an intended width which is substantially constant among piezoelectric segments 2 and in the longitudinal direction of each piezoelectric segment 2.

Etched piezoelectric segments 2 are immersed in the slurry as previously described. Substantially spherical resin particles 3 of the slurry are introduced into the gaps between piezoelectric segments 2. The intervals between piezoelectric segments 2 are adjusted to intervals equal to the particle size of resin particles 3.

Next, piezoelectric segments 2 are dried to remove water present between piezoelectric segments 2. In the gaps between piezoelectric segments 2, resin particles 3 remain held in place, and voids are formed as a result of evaporative removal of water. Subsequently, the set of piezoelectric segments 2 between which the voids have been formed is immersed in epoxy resin 4, or epoxy resin 4 is infiltrated into the gaps between piezoelectric segments 2. As a result, epoxy resin 4 fills the voids by capillary action.

Epoxy resin 4 filling the voids is cured, and thus etched piezoelectric segments 2 having a particular width are fixed by resin 4 at constant intervals defined by resin particles 3. The resulting composite is cut out, and electrode layers 5 are formed on two end surfaces of the composite that are opposite to each other in the Z direction (thickness direction). As previously described, the two end surfaces may be polished before formation of electrode layers 5 to adjust their surface roughness or adjust the thickness of the piezoelectric composite in the Z direction. In this manner, a piezoelectric element having a piezoelectric composite having plate-shaped piezoelectric bodies and resinous bodies alternately arranged is produced.

Figure 3A:
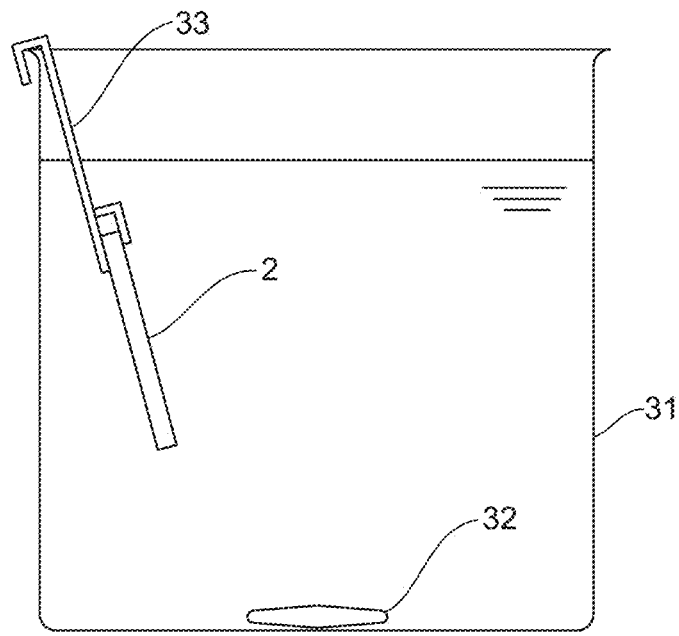
FIG. 3A schematically illustrates how to perform a first etching, and FIG. 3B schematically illustrates the shape of piezoelectric segments etched by the first etching.
Figure 3B:
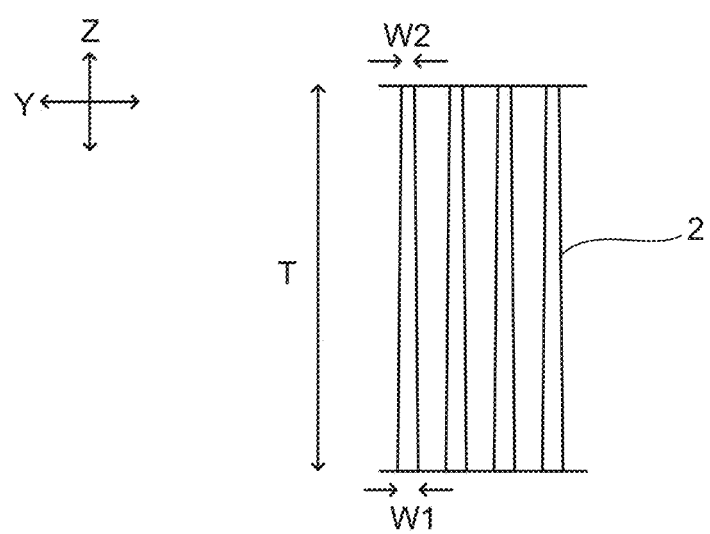
Figure 4A:
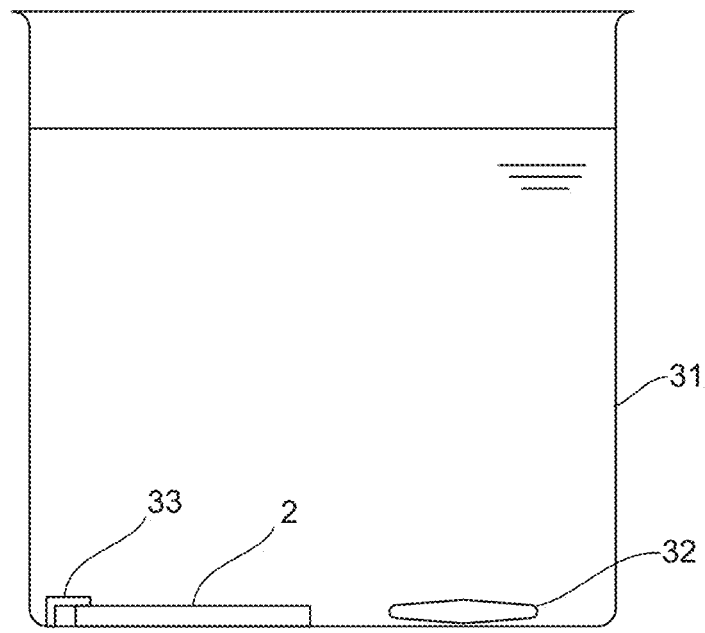
FIG. 4A schematically shows how to perform a second etching, and FIG. 4B schematically illustrates the shape of piezoelectric segments etched by the second etching.
Figure 4B:
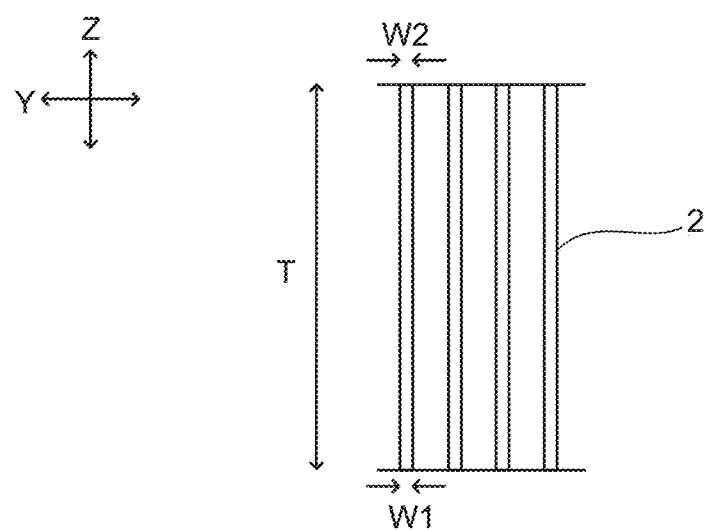

Alternatively, piezoelectric segments 2 may be etched with the above etchant, for example, by being subjected to the above etching including the first etching and second etching ((3) of FIG. 2). FIG. 3A schematically illustrates how to perform the first etching, and FIG. 3B schematically illustrates the shape of the piezoelectric segments etched by the first etching. FIG. 4A schematically illustrates how to perform the second etching, and FIG. 4B schematically illustrates the shape of the piezoelectric segments etched by the second etching.

The etching is carried out, for example, in beaker 31 made of glass and containing the etchant. Beaker 31 is placed on a magnetic stirrer not shown and is equipped with stir bar 32. Piezoelectric segments 2 are held by holder 33 which is engaged with an edge of beaker 31. Piezoelectric segments 2 are placed in the etchant in such a manner that the etchant in the gaps between piezoelectric segments 2 is constantly replaced by being stirred by the stir bar. For example, piezoelectric segments 2 are held by holder 33 inside the etchant in such a position that the direction in which piezoelectric segments 2 are aligned transverses the direction of stirring of the etchant.

In this state, the etchant is stirred by the stir bar, and the etchant flows through the gaps between the plurality of piezoelectric segments 2 without being blocked by piezoelectric segments 2. In consequence, the surface of piezoelectric segments 2 is etched uniformly. When, as previously described, piezoelectric segments 2 having yet to be subjected to the first etching have a taper resulting from dicing, piezoelectric segments 2 maintain the taper after the etching because piezoelectric segments 2 are etched substantially uniformly by the first etching. Thus, after the first etching, the width W1 of one of the two end surfaces of each piezoelectric segment 2 that are opposite to each other in the Z direction remains greater than the width W2 of the other of the end surfaces. For example, W1 is about 11 μm, and W2 is about 10 μm.

Next, as shown in FIG. 4A, piezoelectric segments 2 are placed on the bottom of beaker 31, with the second ends (the extreme ends of the tapers) facing downward. Piezoelectric segments 2 are placed, for example, in such a manner that the direction of stirring of the etchant coincides with the Y direction and that the second ends of piezoelectric segments 2 are in contact with the bottom of beaker 31. Piezoelectric segments 2 placed in beaker 31, in particular on the bottom of beaker 31, are held, for example, from above by holder 33. In this state, the second etching is carried out by stirring the etchant with the stir bar.

In the second etching, the stirring-induced flow of the etchant is smooth around the first ends (upper sides) of piezoelectric segments 2, while the flow of the etchant blocked by piezoelectric segments 2 and present in the gaps between piezoelectric segments 2 is likely to become stagnant. Thus, the first ends of piezoelectric segments 2 are exposed to the stirring-supplied etchant, while the second ends of piezoelectric segments 2 are subjected to the stagnant etchant. The concentration of the active component in the stirring-supplied etchant supplied is substantially constant, and the stagnant etchant is not replaced even after the active component is used in the etching. Additionally, the etchant dissolves the glass of which beaker 31 is made. Thus, the concentration of the etchant stagnant around the second ends of piezoelectric segment 2 is lowered, and the low concentration of the etchant stagnant around the second ends of piezoelectric segment 2 is maintained during the second etching.

In the second etching, therefore, a situation is created where the concentration of the etchant around the first ends of piezoelectric segments 2 is higher than that around the second ends. Thus, in the second etching, the first ends of piezoelectric segment 2 are etched more than the second ends of piezoelectric segments 2. In consequence, as shown in FIG. 4B, the width W1 in the Y direction of piezoelectric segments 2 at the first ends becomes substantially equal to the width W2 at the second ends.

In the above manner, the etching allows all of piezoelectric segments 2 to have a Y-direction width uniform over the entire length in the X direction; namely, piezoelectric segments 2 are shaped by the etching to have an intended width which is substantially constant among piezoelectric segments 2 and in the longitudinal direction of each piezoelectric segment 2.

Nest, the etched piezoelectric segments 2 are immersed in the slurry as previously described. Substantially spherical resin particles 3 of the slurry are introduced into the gaps between piezoelectric segments 2. The intervals between piezoelectric segments 2 are adjusted to intervals equal to the particle size of resin particles 3 ((4) of FIG. 2).

For example, in the case where the piezoelectric segments are pillar-shaped, the gap-adjusting as employed for the plate-shaped piezoelectric bodies may be performed in at least two planar directions in which the piezoelectric segments are arranged. This can result in formation of a piezoelectric composite in which the pillar-shaped piezoelectric bodies are arranged at intended intervals in both of the directions.

Figure 6:
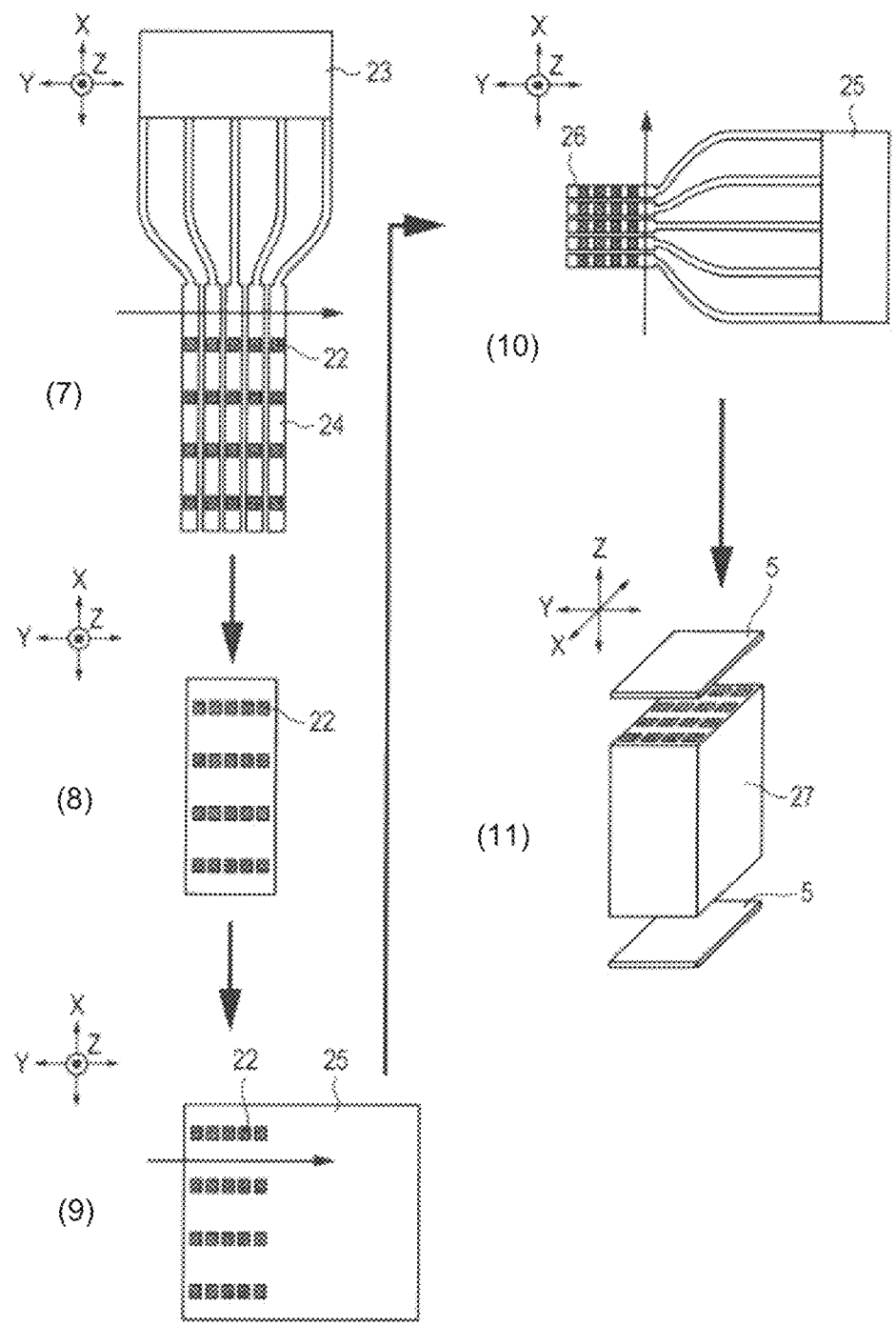
FIG. 6 schematically illustrates the later stage of the exemplary process of producing a piezoelectric element having pillar-shaped piezoelectric bodies from a piezoelectric substrate according to an embodiment of the present invention.

FIG. 5 schematically illustrates the early stage of an exemplary process of producing a piezoelectric element having pillar-shaped piezoelectric bodies from a piezoelectric substrate, and FIG. 6 schematically illustrates the later stage of the exemplary process of producing a piezoelectric element having pillar-shaped piezoelectric bodies from a piezoelectric substrate.

Piezoelectric substrate 1 is cut by dicing in the X direction and Y direction, and thus pillar-shaped piezoelectric segments 22 extending lengthwise in the Z direction and widthwise in the X direction and Y direction are formed. The length of piezoelectric segments 22 is a dimension in the Z direction and equal to or greater than the thickness of the piezoelectric composite. The width of piezoelectric segments 22 is a dimension in each of the X and Y directions. The cuts are formed to extend through piezoelectric substrate 1 except for an end in the Y direction, and all of piezoelectric segments 22 are connected at their ends to the edge of piezoelectric substrate 1. The depth of the cuts (the length of piezoelectric segments 22 in the Z direction) is, for example, 50 to 300 μm.

Piezoelectric segments 22 are etched with the etchant as previously described. As a result of this etching, all of piezoelectric segments 22, like piezoelectric segments 2 previously described, are etched substantially uniformly and shaped to have an intended width which is substantially constant.

Next, the gaps between the adjacent piezoelectric segments 22 having been etched are filled with a resin (first filling). Thus, piezoelectric segments 22 are enclosed by the epoxy resin, with maintenance of the post-etching positional relationship in the X and Y directions. The epoxy resin portion enclosing piezoelectric segments 22 is separated from the end of piezoelectric substrate 1 to prepare first enclosed body 23.

Next, the resinous portion of first enclosed body 23 is cut in the X direction to prepare first resin plates 24 (first arranging). First resin plates 24 are formed by cutting the resinous portion in the X direction, except for an end in the X direction. Each first resin plate is a plate-shaped resin block enclosing a plurality of piezoelectric segments 22 arranged in a line in the X direction.

Subsequently, the plurality of aligned first resin plates 24 in each first enclosed body 23 are immersed in a slurry containing spherical resin particles as previously described and are then dried. As a result, the resin particles are introduced into the gaps between the adjacent first resin plates 24, and the intervals between first resin plates 24 are adjusted to constant intervals (first gap-adjusting; see FIG. 6).

Next, the gaps between first resin plates 24 are further filled with an epoxy resin after the adjustment of the intervals between first resin plates 24 (second filling). Thus, second enclosed body 25 enclosing piezoelectric segments 22 fixedly arranged at intended intervals in the Y direction is produced. Second enclosed body 25 has a portion made of epoxy resin at one end in the Y direction in order to facilitate the subsequent gap adjustment in the X direction.

Next, the resinous portion between piezoelectric segments 22 in second enclosed body 25 is cut in the Y direction to prepare second resin plates 26 (second arranging). Second resin plates 26 are formed by cutting the resinous portion in the Y direction, except for an end in the Y direction. Each second resin plate 26 is a plate-shaped resin block enclosing a plurality of piezoelectric segments 22 arranged in a line in the Y direction.

Next, second resin plates 26 in second enclosed body 25 are immersed in the slurry as previously described and are then dried. As a result, the resin particles as previously described are introduced into the gaps between the adjacent second resin plates 26, and the intervals between second resin plates 26 are adjusted to constant intervals (second gap-adjusting).

Subsequently, the gaps between second resin plates 26 in second enclosed body 25 are filled with an epoxy resin after the adjustment of the intervals between second resin plates 26 (third filling). Thus, piezoelectric segments 22 are fixedly arranged at intended intervals both in the X direction and in the Y direction. The set of second resin plates 26, the X-direction intervals between which has been adjusted, is cut out from second enclosed body 25 to obtain a final enclosed body.

This final enclosed body is used by itself as piezoelectric composite 27 having piezoelectric bodies and resinous bodies alternately arranged or is cut to give piezoelectric composite 27 having a predetermined length (100 to 300 μm, for example) in the Z direction. The two end surfaces of piezoelectric composite 27 that are opposite to each other in the Z direction (thickness direction) are polished as necessary to adjust the surface roughness of the surfaces, and then electrode layers 5 are formed on both of the end surfaces. In this manner, a piezoelectric element having a piezoelectric composite having pillar-shaped piezoelectric bodies and resinous bodies alternately arranged both in the X direction and in the Y direction is produced.

The production method may further include: the gap-adjusting described above; temporarily fixing each of the piezoelectric segments with a temporary-fixing member after the intervals between the piezoelectric segments have been adjusted in the gap-adjusting; and a solidifying in which gaps between the adjacent piezoelectric segments are filled with the above-described resin after the piezoelectric segments have been temporarily fixed in the temporary-fixing, and the resin is solidified to form a piezoelectric composite. The inclusion of these steps is preferred in order to increase the mechanical strength and cohesion of the piezoelectric composite, because in this case the resin used can be a resin such as a two-component epoxy resin which exhibits strong adhesion and sufficiently high post-curing mechanical strength.

The temporary-fixing can be carried out as appropriate to the extent that the plurality of piezoelectric segments can be provisionally fixed with maintenance of the adjusted size of the gaps between the piezoelectric segments. The temporary-fixing can be accomplished using an appropriate member for temporary-fixing.

For example, the temporary-fixing can include: placing the plurality of piezoelectric segments on a substrate; sandwiching the plurality of piezoelectric segments on the substrate by a support member from both sides in an arrangement direction in which the piezoelectric segments are aligned; and bonding the substrate, the support member, and the plurality of piezoelectric segments sandwiched by the support member, using an adhesive tape in such a manner that the adhesive tape extends between sections of the substrate that are located outside the support member in the arrangement direction. In such a temporary-fixing, the substrate, the support member, and the adhesive tape collectively correspond to the temporary-fixing member.

The substrate can be selected as appropriate to the extent that the plurality of piezoelectric segments subjected to the gap adjustment can be placed on the substrate. In order to easily separate the produced piezoelectric composite, the substrate is preferably a member at least the surface of which is composed of a material such as fluorine resin which allows easy release therefrom.

The support member can be selected as appropriate to the extent that the plurality of aligned piezoelectric segments can be sandwiched from both sides in the arrangement direction. The support member may be a single member or may consist of a plurality of members. The height of the support member placed on the substrate is preferably slightly smaller than that of the piezoelectric segments on the substrate (the intervals between the first end and second end), because in this case the adhesive tape can be in contact with each of the piezoelectric segments.

The material of the support member is not limited. In order to allow the adhesive tape to exhibit sufficient adhesion to the support member as well as to the piezoelectric segments, the material of the support member is preferably a piezoelectric material and more preferably a piezoelectric material identical to that of the piezoelectric segments.

The adhesive tape can be selected as appropriate to the extent that the adhesive tape can adhere at least to the surface of the substrate. In order to temporarily fix the piezoelectric segments with sufficient rigidity, the adhesive tape preferably has sufficient adhesion not only to the surface of the substrate but also to the support member and the piezoelectric segments. In order to achieve stable temporary-fixing of the piezoelectric segments, the adhesive tape preferably has sufficient levels of resistance properties such as heat resistance and chemical resistance. Examples of the adhesive tape include Kapton tape ("Kapton" is a registered trademark of E.I. DuPont de Nemours and Company).

The solidifying can be carried out as appropriate depending on the type of the resin. For example, the filling of the gaps with the resin can be accomplished by introducing a liquid resin into the gaps between the piezoelectric segments by capillary action after the adjustment of the intervals. The solidification of the resin can be accomplished as appropriate by heating, humidification, depressurization, or any combination thereof.

Figure 7:
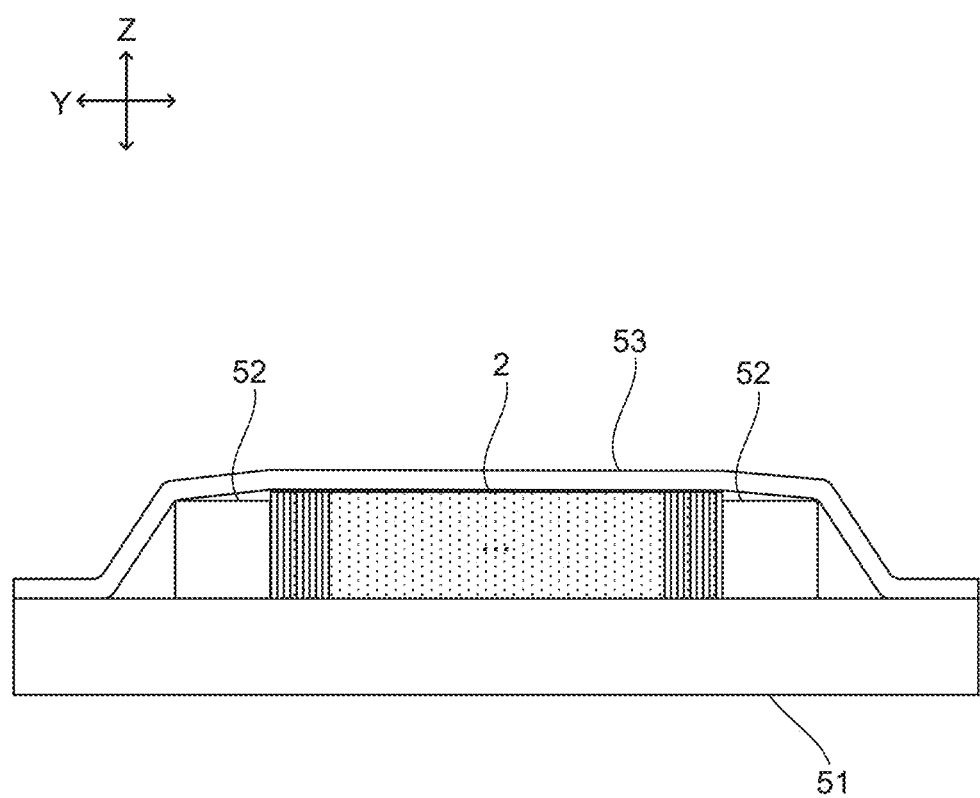
FIG. 7 schematically illustrates an example of how to fix etched piezoelectric segments on a substrate.

For example, the temporary-fixing and the solidifying can be carried out in the following manner. First, as shown in FIG. 7, piezoelectric segments 2 are fixed on substrate 51. Substrate 51 is made of fluorine resin. The placement of piezoelectric segments 2 on substrate 51 is done with the vertical direction coinciding with the Z direction. Next, support members 52 are placed on substrate 51 in such a manner as to sandwich piezoelectric segments 2 from both sides in the Y direction. Support members 52 are rectangular rods made of a piezoelectric material, and the height (the length in the Z direction) of the rods is slightly smaller than that of piezoelectric segments 2. Subsequently, adhesive tape 53 is attached to substrate 51 in such a manner as to extend between regions of the surface of substrate 51 that are located outside support members 52 in the Y direction. Adhesive tape 53 is Kapton tape. Adhesive tape 53 adheres to the surface of substrate 51, the edge of support members 52, and the upper edge of each of piezoelectric segments 2 and extends to cover substrate 51, support members 52, and piezoelectric segments 2. Thus, piezoelectric segments 2 are fixed on substrate 51, with maintenance of the constant intervals between piezoelectric segments 2 in the Y direction.

Next, piezoelectric segments 2 are dried to remove water from the gaps between piezoelectric segments 2. In the gaps between piezoelectric segments 2, resin particles 3 remain held in place, and voids are formed as a result of evaporative removal of water. Subsequently, the set of piezoelectric segments 2 between which the voids have been formed is immersed in epoxy resin 4, or epoxy resin 4 is infiltrated into the gaps between piezoelectric segments 2. As a result, epoxy resin 4 fills the voids by capillary action.

Epoxy resin 4 filling the voids is cured, and thus the etched piezoelectric segments 2 having a particular width are fixed by resin 4 at constant intervals defined by resin particles 3. As a result, a piezoelectric composite including the etched piezoelectric segments 2 fixed by the resin is formed. After that, adhesive tape 53 is detached from substrate 51 and piezoelectric segments 2, and the piezoelectric composite is separated from substrate 51. The piezoelectric composite is cut ((6) of FIG. 2), and electrode layers 5 are formed ((7) of FIG. 2) on two end surfaces of the piezoelectric composite that are opposite to each other in the Z direction (thickness direction). In this manner, a piezoelectric element having a piezoelectric composite having plate-shaped piezoelectric bodies and resinous bodies alternately arranged is produced.

The production method may further include the following steps to form an electrode on the piezoelectric composite: a surface roughness adjusting of polishing an end surface of the piezoelectric composite, the end surface being an end surface at which all of the piezoelectric bodies are exposed (an end surface in the thickness direction of the piezoelectric composite); and electrode-placing in which an electrode is placed on the polished end surface.

The surface roughness adjusting can be carried out using a known method for adjusting the surface roughness of a piezoelectric composite in production of piezoelectric elements. For example, the surface roughness adjusting can be carried out by a known method such as blasting using abrasive grains having a grain size of 0.5 µm, 1 µm, or 2 µm. The surface roughness of the end surface, as expressed by an arithmetic average roughness Ra, is preferably 150 to 250 nm in order to, for example, increase the adhesion of the electrode to be formed to the end surface (the anchoring effect of the piezoelectric composite).

The electrode-placing can also be carried out using a known method for forming an electrode on an end surface of a piezoelectric composite in production of piezoelectric elements. The material of the electrode can be selected as appropriate from known materials and compounds usable as the material of electrodes in piezoelectric elements. For example, the electrode-placing can be carried out by plating, sputtering, or vapor deposition.

The production method may further include polishing a pair of end surfaces of the piezoelectric composite. The pair of end surfaces are surfaces at which each of the piezoelectric bodies in the piezoelectric composite is exposed or to be exposed, and these end surfaces can be referred to as two end surfaces of the piezoelectric composite that are opposite to each other in a direction in which the piezoelectric bodies extend.

The polishing is suitable for adjusting the thickness of the piezoelectric composite. The polishing for thickness adjustment can be carried out by a known technique used for adjustment of the thickness of piezoelectric composites. The thickness of the piezoelectric composite can be determined as appropriate depending on the intended application and is, for example, 100 to 300 µm.

The polishing is suitable for adjusting that end surface of the piezoelectric composite on which an electrode is to be formed. The polishing for surface roughness adjustment can be carried out using a known method for adjusting the surface roughness of an end surface of a piezoelectric composite in production of piezoelectric elements. For example, the polishing for surface roughness adjustment can be carried out by a known method such as blasting using abrasive grains having a grain size of 0.5 µm, 1 µm, or 2 µm. The surface roughness of the end surface, as expressed by an arithmetic average roughness Ra, is preferably 150 to 250 nm in order to, for example, increase the adhesion of the electrode to be formed to the end surface (the anchoring effect of the piezoelectric composite).

As previously described, when the piezoelectric base described above is cut by dicing to form a plurality of aligned piezoelectric segments, the shape of a taper formed in the dicing blade may be transferred to the cut surface of each piezoelectric segment. When the piezoelectric segments having a taper resulting from the transfer are etched, the etched piezoelectric segments may maintain the taper. If the etched piezoelectric segments have the taper, a phenomenon called herein element tilting, in which the piezoelectric segments are tilted, may occur during production of piezoelectric composites, thus resulting in a decrease in the production yield of piezoelectric elements. Thus, concerning piezoelectric composite production including etching, there is room to make an investigation in terms of prevention of the element tilting. Among embodiments of the present invention, the above-described embodiment including the first and second etchings is a means for achieving the object of providing a piezoelectric element production method that can avoid element tilting during production of piezoelectric composites.

That is, in order for the tapering caused in each piezoelectric segment as a result of cutting of the piezoelectric base to be substantially eliminated by the etching, the embodiment including the first and second etchings employs a combination of isotropic etching for uniformly etching the entire surface of the plurality of aligned piezoelectric segments and anisotropic etching for preferentially etching a region around the starting points of the tapers of the piezoelectric segments. According to this embodiment, the thickness of the plurality of piezoelectric segments in the arrangement direction can be made substantially uniform, and thus element tilting during production of piezoelectric composites can be prevented. That is, according to the above embodiment, tapers formed by the cutting process can be cancelled by the etchings. This can eliminate the occurrence of element tilting during piling of the piezoelectric segments, thus making it possible to obtain a piezoelectric composite in which the piezoelectric segments are evenly arranged.

The piezoelectric element is applicable to an ultrasonic probe. The ultrasonic probe has, for example, an ultrasonic transducer in which a plurality of the piezoelectric elements are arranged. The piezoelectric element has good piezoelectric properties, and thus the ultrasonic probe having the piezoelectric element has high transmission/reception sensitivity and is capable of both exhibiting high spatial resolution and achieving long-distance measurement.

Therefore, the ultrasonic probe is applicable to an ultrasonic imaging device and is particularly suitable as an ultrasonic probe for an ultrasonic diagnostic apparatus or non-destructive testing apparatus. Having the ultrasonic probe, the ultrasonic imaging device exhibits high spatial resolution even for distant objects and is capable of providing detailed testing results that allow accurate and reliable diagnosis in medical diagnosing or non-destructive testing.

As is apparent from the foregoing description, the method for producing a piezoelectric element according to the present embodiment is a method for producing a piezoelectric element including a piezoelectric composite having piezoelectric bodies made of a Pb-based piezoelectric material and resinous bodies alternately arranged, and the method includes etching a plurality of aligned piezoelectric segments formed by dicing with an etchant, wherein a liquid containing 0.1 to 20 mass % of hexafluorosilicic acid is used as the etchant. With this production method, a plurality of piezoelectric segments can be etched uniformly by wet etching. Consequently, decrease in the production yield of piezoelectric composites can be reduced, and the efficiency of production of piezoelectric composites and piezoelectric elements can be increased.

In order to promote the etching, it is more advantageous that the etchant further contains one or more compounds selected from the group consisting of nitric acid, ammonium fluoride, and sodium fluoride, and the content of each of the compounds in the etchant is 1 to 10 mass %.

In order to increase the uniformity of the etching, it is more advantageous that an etching rate in the etching is less than 2 µm/min.

In order to increase the ease of handling of the piezoelectric segments in the etching, it is more advantageous that all of the plurality of aligned piezoelectric segments are integrally connected to a piezoelectric base.

It is preferable that the etched piezoelectric segments have a width of 30 µm or less and a thickness of 80 µm or more, because the beneficial effect of the etching in production of piezoelectric composite can be easily exhibited.

In order to make substantially uniform the thickness of the plurality of piezoelectric segments in the aligning direction and thereby prevent element tilting during production of a piezoelectric composite, it is more advantageous that each of the plurality of piezoelectric segments has a taper extending in a direction from a first end toward a second end of the piezoelectric element, the second end being opposite to the first end, and the etching includes: a first etching in which the plurality of piezoelectric segments are etched by causing the etchant to flow relative to the piezoelectric segments in such a manner that the concentration of the etchant is constant between first ends and second ends of the piezoelectric segments; and a second etching in which the plurality of piezoelectric segments are etched under a condition where the concentration of the etchant is higher around the first ends than around the second ends of the piezoelectric segments.

In order to uniformly etching those sections of the piezoelectric segments which are immersed in the etchant, it is more advantageous that in the first etching, the etchant is caused to flow in such a direction that the etchant passes through gaps between the plurality of piezoelectric segments without being blocked by the piezoelectric segments.

In order to eliminate the tapers extending toward the second ends of the piezoelectric segments and forming the piezoelectric segments into a straight, uniform shape, it is more advantageous that in the second etching, the etchant be caused to flow faster around the first ends in a direction in which the plurality of piezoelectric segments are aligned than around the second ends.

In order to etch a section on the first ends of the piezoelectric segments much more preferentially than a section on the second ends of the piezoelectric segments, it is more advantageous that in the second etching, the plurality of piezoelectric segments are disposed to be in contact with a supporting section on the second ends in the etchant. From the same viewpoint, it is more advantageous that the supporting section is composed of a material dissolvable by the etchant.

In order to produce a piezoelectric element in which plate-shaped piezoelectric bodies are arranged at intended intervals, it is more advantageous that the piezoelectric segments are plate-shaped and that the production method further includes adjusting intervals between adjacent ones of the etched piezoelectric segments to constant intervals; and filling gaps between the adjacent piezoelectric segments with a resin after the adjustment of the intervals.

In order to produce a piezoelectric element in which pillar-shaped piezoelectric bodies are arranged at intended intervals in planar directions, it is more advantageous that the piezoelectric segments are pillar-shaped and that the production method further includes: a first filling in which the gaps between adjacent ones of the etched piezoelectric segments are filled with a resin; a first arranging in which a section formed of the resin between the piezoelectric segments is cut in a first direction of two planar directions so as to form first resin plates each including a plurality of the piezoelectric segments enclosed by the resin and arranged in a line in the first direction; a first gap-adjusting in which intervals between adjacent ones of the plurality of aligned first resin plates are adjusted to constant intervals; a second filling in which gaps between the plurality of first resin plates are filled with a resin after the adjustment of the intervals; a second arranging in which a section formed of the resin between the piezoelectric segments is cut in a second direction of the two planar directions so as to form second resin plates each including a plurality of the piezoelectric segments enclosed by the resin and arranged in a line in the second direction; a second gap-adjusting in which intervals between adjacent ones of the plurality of aligned second resin plates are adjusted to constant intervals; and a third filling in which gaps between the plurality of second resin plates are filled with a resin after the adjustment of the intervals.

In order to prevent element tilting of the piezoelectric segments during curing of the resin and in order to increase the adhesion of the resin to the piezoelectric segments, it is more advantageous that the production method further include: gap-adjusting intervals between adjacent ones of the plurality of piezoelectric segments etched in the etching; temporarily fixing each of the plurality of piezoelectric segments with a temporary-fixing member after the adjustment of the intervals in the gap-adjusting; and solidifying in which gaps between adjacent ones of the plurality of piezoelectric segments are filled with a resin after the temporary-fixing of the piezoelectric segments and the resin is solidified to form the piezoelectric composite.

From the same viewpoint, that is, in order to prevent element tilting of the piezoelectric segments during curing of the resin and in order to increase the adhesion of the resin to the piezoelectric segments, it is more advantages that a substrate, a support member, and an adhesive tape are used as the temporary-fixing member and that the temporary-fixing further includes: placing the plurality of piezoelectric segments on the substrate; sandwiching the plurality of piezoelectric segments on the substrate by the support member from both sides in an arrangement direction in which the piezoelectric segments are aligned; and bonding the substrate, the support member, and the plurality of piezoelectric segments sandwiched by the support member, using the adhesive tape in such a manner that the adhesive tape extends between sections of the substrate that are located outside the support member in the arrangement direction.

In order to increase the adhesion of an electrode to the piezoelectric composite, it is more advantageous that the production method includes: polishing a pair of end surfaces of the piezoelectric composite that are opposite to each other in a direction in which the piezoelectric bodies extend; and forming an electrode on each of the polished end surfaces.

EXAMPLES

[Forming Dicing-Processed Substrate]

A PMN-PT substrate (available from Nihonkai Medical K.K. under the product name "PMN-PT/Lead Magnesium Niobate-Lead Titanate") having a length of 20 mm, a width of 20 mm, and a thickness of 0.5 mm was prepared as a piezoelectric base. Next, the PMN-PT substrate was subjected to dicing to form cuts extending from one end of the PMN-PT substrate to the vicinity of the opposite end in the length (X) direction, extending through the PMN-PT substrate in the thickness (Z) direction, and arranged at equal intervals in the width (Y) direction. In this manner, a dicing-processed substrate having 30 plate-shaped piezoelectric segments integrally coupled to the opposite end of the substrate. The plane orientation of the 20 mm×20 mm surface of the PMN-PT is the 001 orientation.

Each piezoelectric segment in the dicing-processed substrate had a length (dimension in the X direction) of 25 mm, a width (dimension in the Y direction) of 50 μm (=0.05 mm), and a thickness (dimension in the Z direction) of 500 μm. The cuts formed by the dicing had a width (dimension in the Y direction) of 20 μm.

[Preparation of Etchant 1]

The following components were mixed in the indicated proportions to obtain Etchant 1.

| Hexafluorosilicic acid | 2 mass % |
|---|---|
| Nitric acid | 3 mass % |
| Ammonium fluoride | 2 mass % |
| Water | Rest |

[Preparation of Etchants 2 to 4]

Etchant 2 was obtained in the same manner as etchant 1 was prepared, except that ammonium fluoride was not added. Etchant 3 was obtained in the same manner as etchant 1 was prepared, except that nitric acid and ammonium fluoride were not added. Further, etchant 4 was obtained in the same manner as etchant 1 was prepared, except that sodium fluoride (SF) was used instead of ammonium fluoride.

[Preparations of Etchants 5 to 8]

Etchant 8 was obtained in the same manner as etchant 1 was prepared, except that the amounts of hexafluorosilicic acid and ammonium fluoride were changed to 8 mass % and that the amount of nitric acid was changed to 12 mass %.

Etchant 5 was obtained by diluting etchant 8 with water so that the amounts of hexafluorosilicic acid and ammonium fluoride were reduced to 1 mass % and that the amount of nitric acid was reduced to 1.5 mass %. Etchant 6 was obtained by diluting etchant 8 with water so that the amounts of hexafluorosilicic acid and ammonium fluoride were reduced to 4 mass % and that the amount of nitric acid was reduced to 6 mass %. Etchant 7 was obtained by diluting etchant 8 with water so that the amounts of hexafluorosilicic acid and ammonium fluoride were reduced to 0.5 mass % and that the amount of nitric acid was reduced to 0.75 mass %.

[Preparation of Etchants 9 and 10]

37 mass % hydrochloric acid (HA) was prepared and used as etchant 9. Etchant 10 was prepared in the same manner as etchant 1 was prepared, in the same manner hexafluorosilicic acid was not added.

Example 1

100 mL of etchant 1 and a stir bar were placed in a 100 mL beaker made of PTFE (fluorine resin), and etchant 1 was stirred using a magnetic stirrer at 300 rpm. The temperature (Etemp) of etchant 1 was 28° C.

The etching of the dicing-processed substrate was carried out in four stages. In the first stage (S1), the piezoelectric segment section of the dicing-processed substrate was placed in a first etching position in the etchant 1 stirred at a rotation speed of 300 rpm. The first etching position was a position where one of the Z-direction ends of each piezoelectric segment faced the direction of stirring-induced flow of etchant 1. In the second stage (S2), the rotation speed was maintained at 300 rpm, and the piezoelectric segment section of the dicing-processed substrate was placed in a second etching position in the etchant 1. The second etching position was a position where the other of the Z-direction ends of each piezoelectric segment faced the direction of the flow. In the third stage (S3), the piezoelectric segment section was placed in the first etching position in the etchant 1 stirred at a rotation speed of 200 rpm. In the fourth stage (S4), the piezoelectric segment section was placed in the second etching position in the etchant 1 stirred at a rotation speed of 200 rpm.

The etching time (Etime) was 30 minutes in the first stage and second stage and 10 minutes in the third stage and fourth stage. As a result of such etching, etching-processed substrate 1 having a set of wet-etched piezoelectric segments was obtained.

Next, the piezoelectric segment section of etching-processed substrate 1 thus obtained was immersed and rinsed with a resin emulsion to introduce resin particles into the gaps between the piezoelectric segments. The resin emulsion was prepared by adding 3 mL of a polymer latex particles ("micromer" available from Corefront Corporation) containing 12-μm-diameter spherical polystyrene-based particles dispersed in water to 20 mL of ultrapure water followed by mixing. Etching-processed substrate 1 rinsed with the resin emulsion was placed and dried on a fluorine-coated resin sheet.

Next, a two-component epoxy resin (C-1163, available from TESK CO., LTD.) was suppled onto etching-processed substrate 1 dried on the resin sheet, and thus the gaps between the piezoelectric segments were filled with the liquid epoxy resin. To remove bubbles from the filling epoxy resin, etching-processed substrate 1 having the gaps filled with the epoxy resin was left in a reduced pressure atmosphere ($10^{-3}$ Pa) for 30 minutes. Next, etching-processed substrate 1 was allowed to stand in a 50° C. environment for 20 hours to cure the epoxy resin.

Subsequently, the resulting resin-cured section, in which plate-shaped piezoelectric segments spaced from each other at desired intervals and resinous bodies were alternately arranged, was cut in the Y direction (in which the piezoelectric segments and the resinous bodies were alternately arranged) to have a predetermined length in the X direction (the length direction of the piezoelectric segments). In this manner, piezoelectric composite 1 was obtained having plate-shaped piezoelectric segments spaced from each other at desired intervals and resinous bodies alternately arranged.

Next, the Z-direction end surfaces of piezoelectric composite 1 were polished using a polishing machine available from Musashino Denshi together with 9-μm abrasive grains to adjust the thickness (dimension in the Z direction) of piezoelectric composite 1, and then the end surfaces were polished using 3-μm abrasive grains to adjust the surface roughness of the end surfaces. The resulting thickness of piezoelectric composite 1 was 200 μm, and the resulting surface roughness of the end surfaces, as expressed by an arithmetic average roughness Ra, was 80 nm.

Figure 8A:
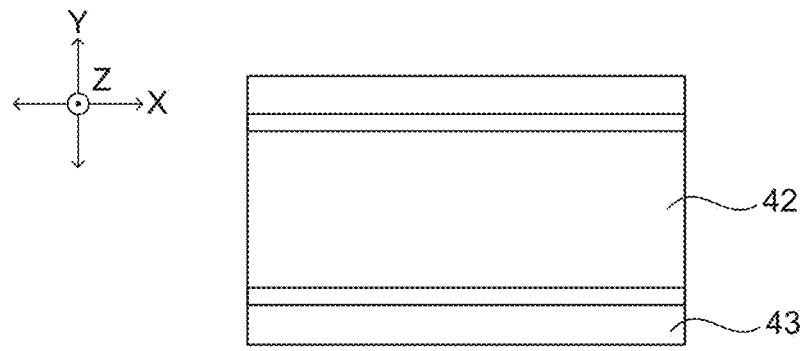
FIG. 8A is a plan view schematically illustrating the configuration of a piezoelectric element produced in Example.
Figure 8B:
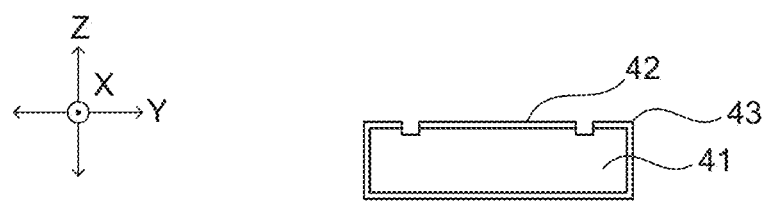
FIG. 8B is a side view schematically illustrating the configuration of the piezoelectric element of FIG. 8A.
Figure 8C:
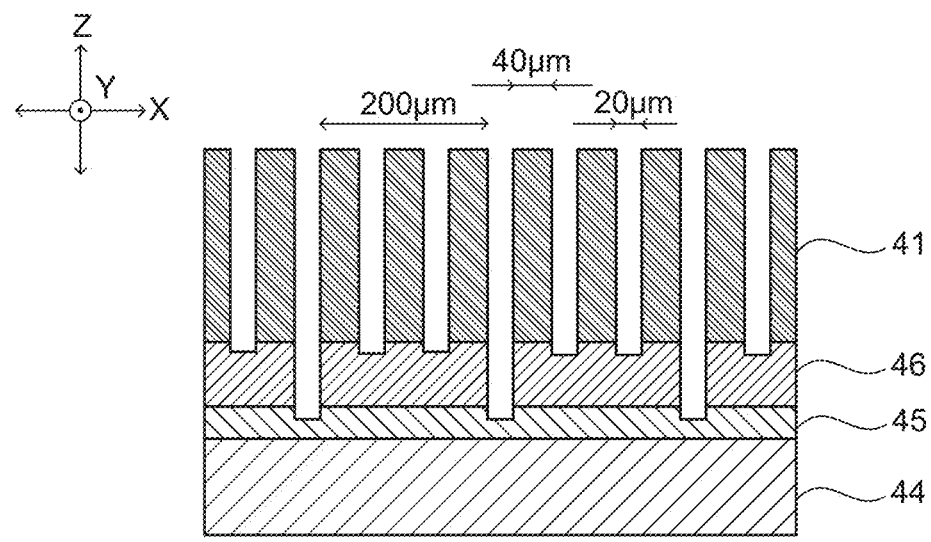
FIG. 8C is an enlarged cross-sectional view schematically illustrating a part of a cross-section of the piezoelectric element taken in the X direction.

Next, an electrode layer was formed by sputtering on the Y-direction end surfaces and Z-direction end surfaces of piezoelectric composite 1 (denoted by the reference sign 41 in the drawings). FIG. 8A is a plan view schematically illustrating the configuration of a piezoelectric element produced in this example, and FIG. 8B is a side view schematically illustrating the configuration of the piezoelectric element of FIG. 8A. FIG. 8C is an enlarged cross-sectional view schematically illustrating a part of a cross-section of the piezoelectric element of FIG. 8A taken in the X direction.

The electrode layer consisted of a 4-nm-thick chromium (Cr) layer placed in direct contact with piezoelectric composite 1 and a 450-nm-thick gold (Au) layer placed on the chromium layer. At two opposite positions on one of the Z-direction end surfaces of piezoelectric composite 1, cuts extending in the X direction were formed as shown in FIG. 8A and FIG. 8B using a cutting device. Thus, section 42 serving as a positive electrode (positive electrode section) and section 43 serving as a negative electrode (negative electrode section) were formed in the electrode layer.

Next, backing plate 44, flexible substrate (FPC) 45, dematching layer (DML) 46 formed by a tungsten plate, and piezoelectric composite 1 (denoted by reference sign 41 in the drawings) were stacked in the order mentioned and bonded together to obtain piezoelectric laminate 1. In piezoelectric laminate 1, piezoelectric composite 1 was placed in such a manner that the cuts described are remote from DML 46. The thickness of the backing plate was 2 mm, the thickness of FPC was 60 μm, and the thickness of DML was 50 μm.

Next, in piezoelectric laminate 1, 20-μm-wide first cuts extending in the Y direction and reaching from the electrode layer to FPC were formed at a pitch of 200 μm along the X direction as shown in FIG. 8C. The first cuts define pixels in piezoelectric element 1. Further, in each pixel of piezoelectric laminate 1, 20-μm-wide second cuts extending in the Y direction and reaching from the electrode layer to DML were formed at a pitch of 40 μm along the X direction. In this manner, piezoelectric element 1 was produced in which the periodic structure of piezoelectric segments and resinous bodies had been subjected to dicing in the vertical direction.

The X-direction end surface of piezoelectric element 1 was observed with an optical microscope available from KEYENCE CORPORATION at a magnification of 500, and the width (dimension in the Y direction) of each piezoelectric body in piezoelectric composite 1 was measured. The width of the piezoelectric bodies was 10 μm on average and the width of the resinous bodies was 12 μm on average.

Further, the maximum and minimum values of the width of the piezoelectric bodies were determined, and a difference ΔW (μm) calculated by subtracting the minimum value from the maximum value was determined as an index of the variation in element width. Additionally, an etching rate (Erate) was determined from the average width of the piezoelectric bodies and the etching time. For piezoelectric element 1, ΔW was 2 μm and Erate was 0.5 μm/min. For the present examples, ΔW of 5 μm or less was rated acceptable.

Example 2

Piezoelectric element 2 was produced in the same manner as piezoelectric element 1 was produced, except that etchant 2 was used instead of etchant 1 and that the etching time was 10 minutes in first stage, 10 minutes in the second stage, 60 minutes in the third stage, and 60 minutes in the fourth stage and was 140 minutes in total. For piezoelectric element 2, ΔW was 2 μm and Erate was 0.3 μm/min.

Example 3

Piezoelectric element 3 was produced in the same manner as piezoelectric element 1 was produced, except that etchant 3 was used instead of etchant 1 and that the etching time was 30 minutes in the first stage, 30 minutes in the second stage, 150 minutes in the third stage, and 150 minutes in the fourth stage and was 400 minutes in total. For piezoelectric element 3, ΔW was 2 μm and Erate was 0.15 μm/min.

Example 4

Piezoelectric element 4 was produced in the same manner as piezoelectric element 1 was produced, except that etchant 4 was used instead of etchant 1 and that the etching time was 10 minutes in the first stage, 10 minutes in the second stage, 35 minutes in the third stage, and 35 minutes in the fourth stage and was 90 minutes in total. For piezoelectric element 4, ΔW was 2 μm and Erate was 0.45 μm/min.

Example 5

Piezoelectric element 5 was produced in the same manner as piezoelectric element 1 was produced, except that etchant 5 was used instead of etchant 1 and that the etching time was 15 minutes in the first stage, 15 minutes in the second stage, 90 minutes in the third stage, and 90 minutes in the fourth stage and was 210 minutes in total. For piezoelectric element 5, ΔW was 2 μm and Erate was 0.19 μm/min.

Example 6

Piezoelectric element 6 was produced in the same manner as piezoelectric element 1 was produced, except that etchant 6 was used instead of etchant 1 and that the etching time was 5 minutes in the first stage, 5 minutes in the second stage, 15 minutes in the third stage, and 15 minutes in the fourth stage and was 40 minutes in total. For piezoelectric element 6, ΔW was 2 μm and Erate was 1.0 μm/min.

Example 7

Piezoelectric element 7 was produced in the same manner as piezoelectric element 1 was produced, except that etchant 7 was used instead of etchant 1 and that the etching time was 60 minutes in the first stage, 60 minutes in the second stage, 185 minutes in the third stage, and 185 minutes in the fourth stage and was 490 minutes in total. For piezoelectric element 7, ΔW was 1.5 μm and Erate was 0.08 μm/min.

Example 8

Piezoelectric element 8 was produced in the same manner as piezoelectric element 1 was produced, except that etchant 8 was used instead of etchant 1 and that the etching time was 3 minutes in the first stage, 3 minutes in the second stage, 4.5 minutes in the third stage, and 4.5 minutes in the fourth stage and was 15 minutes in total. For piezoelectric element 8, ΔW was 4 μm and Erate was 2.7 μm/min.

Example 9

Piezoelectric element 9 was produced in the same manner as piezoelectric element 1 was produced, except that the etching temperature was changed to 32° C. and that the etching time was 15 minutes in the first stage, 15 minutes in the second stage, 72.5 minutes in the third stage, and 72.5 minutes in the fourth stage and was 175 minutes in total. For piezoelectric element 9, ΔW was 2 μm and Erate was 0.23 μm/min.

Example 10

Piezoelectric element 10 was produced in the same manner as piezoelectric element 1 was produced, except that the etching temperature was changed to 49° C. and that the etching time was 3 minutes in the first stage, 3 minutes in the second stage, 4.5 minutes in the third stage, and 4.5 minutes in the fourth stage and was 15 minutes in total. For piezoelectric element 10, ΔW was 4 μm and Erate was 2.7 μm/min.

Example 11

Piezoelectric element 11 was produced in the same manner as piezoelectric element 1 was produced, except that the etching temperature was changed to 20° C. and that the etching time was 100 minutes in the first stage, 100 minutes in the second stage, 150 minutes in the third stage, and 150 minutes in the fourth stage and was 500 minutes in total. For piezoelectric element 11, ΔW was 1.5 μm and Erate was 0.08 μm/min.

Example 12

Piezoelectric element 12 was produced in the same manner as piezoelectric element 1 was produced, except that the piezoelectric base was changed to a PZT substrate (available from Lead Techno Co., Ltd. under the product name "K101") and that the etching temperature was changed to 20° C., and that the etching time was 5 minutes in all of the first to fourth stages and was 20 minutes in total. For piezoelectric element 12, ΔW was 3.7 μm and Erate was 2.0 μm/min.

Example 13

A piezoelectric element 13 was produced in the same manner as piezoelectric element 1 was produced, except that the piezoelectric base was changed to a PIN-PMN-PT substrate (available from CTG Advanced Materials, LLC under the product name "PIN-PMN-PT (Lead Indium Niobate-Lead Magnesium Niobate-Lead Titanate)") and that the etching time was 5 minutes in the third and fourth stages and was 70 minutes in total. For piezoelectric element 13, ΔW was 2 μm and Erate was 0.56 μm/min.

Comparative Example 1

Piezoelectric element C1 was produced in the same manner as piezoelectric element 1 was produced, except that etchant 9 was used instead of etchant 1, that the etching temperature was changed to 80° C., and that the etching time was 5 minutes in the first stage, 5 minutes in the second stage, 10 minutes in the third stage, and 10 minutes in the fourth stage and was 30 minutes in total. For piezoelectric element C1, ΔW was 13 μm and Erate was 7.0 μm/min.

Comparative Example 2

Piezoelectric element C2 was produced in the same manner as piezoelectric element 1 was produced, except that etchant 10 was used instead of etchant 1. For piezoelectric element C2, ΔW was 6 μm and Erate was 0.5 μm/min.

For piezoelectric elements 1 to 13, C1, and C2, the etching conditions and ΔW are shown in Table 1. In the table, "HFS" denotes hexafluorosilicic acid, "NA" denotes nitric acid, and "AF" denotes ammonium fluoride.

Reference Example

In the PMN-PT substrate, cuts having a depth of 200 μm from the surface of the substrate in the Z direction were formed at intervals in the X direction and in the Y direction. Thus, a dicing-processed substrate having a plurality of pillar-shaped piezoelectric segments arranged in both of the X and Y directions was produced. The width of each piezoelectric segment in the X and Y direction was 50 μm, and the width of the cuts was 20 μm.

Etchants A and B containing the following components in the indicated amounts were prepared.

(Etchant A)

| Hexafluorosilicic acid | 4 mass % |
| Ammonium fluoride | 1 mass % |

TABLE 1

| | | Etchant | | | | | Etching Etime (minutes) | | | | | | | |
|---|---|---|---|---|---|---|---|---|---|---|---|---|---|---|
| | No. | HFS (mass %) | NA (mass %) | AF (mass %) | SF (mass %) | HA (mass %) | S1 | S2 | S3 | S4 | Total | Etemp (° C.) | Erate (μm/min) | ΔW (μm) |
| Example 1 | 1 | 2 | 3 | 2 | — | — | 30 | 30 | 10 | 10 | 80 | 28 | 0.5 | 2 |
| Example 2 | 2 | 2 | 3 | — | — | — | 10 | 10 | 60 | 60 | 140 | 28 | 0.3 | 2 |
| Example 3 | 3 | 2 | — | — | — | — | 30 | 30 | 150 | 150 | 400 | 28 | 0.15 | 2 |
| Example 4 | 4 | 2 | 3 | — | 2 | — | 10 | 10 | 35 | 35 | 90 | 28 | 0.45 | 2 |
| Example 5 | 5 | 1 | 1.5 | 1 | — | — | 15 | 15 | 90 | 90 | 210 | 28 | 0.19 | 2 |
| Example 6 | 6 | 4 | 6 | 4 | — | — | 5 | 5 | 15 | 15 | 40 | 28 | 1.0 | 2 |
| Example 7 | 7 | 0.5 | 0.75 | 0.5 | — | — | 60 | 60 | 185 | 185 | 490 | 28 | 0.08 | 1.5 |
| Example 8 | 8 | 8 | 12 | 8 | — | — | 3 | 3 | 4.5 | 4.5 | 15 | 28 | 2.7 | 4 |
| Example 9 | 1 | 2 | 3 | 2 | — | — | 15 | 15 | 72.5 | 72.5 | 175 | 32 | 0.23 | 2 |
| Example 10 | 1 | 2 | 3 | 2 | — | — | 3 | 3 | 4.5 | 4.5 | 15 | 49 | 2.7 | 4 |
| Example 11 | 1 | 2 | 3 | 2 | — | — | 100 | 100 | 150 | 150 | 500 | 20 | 0.08 | 1.5 |
| Example 12 | 1 | 2 | 1 | 1 | — | — | 5 | 5 | 5 | 5 | 20 | 20 | 2.0 | 3.7 |
| Example 13 | 1 | 2 | 3 | 2 | — | — | 30 | 30 | 5 | 5 | 70 | 80 | 0.56 | 2 |
| Comparative Example 1 | 9 | — | — | — | — | 37 | 5 | 5 | 10 | 10 | 30 | 80 | 7.0 | 13 |
| Comparative Example 2 | 10 | — | 3 | 2 | — | — | 30 | 30 | 10 | 10 | 80 | 28 | 0.5 | 6 |

For all of piezoelectric elements 1 to 13 having a periodic structure of alternately arranged piezoelectric bodies and resinous bodies, as is apparent from the above table, the length of the piezoelectric bodies in the arrangement direction is substantially uniform irrespective of the type of the piezoelectric bodies. A trend is observed that decreasing the etching rate further reduces the variation in the length of the piezoelectric bodies in the arrangement direction.

By contrast, for piezoelectric element C1, the variation in the length of the piezoelectric bodies in the arrangement direction is large. This can be attributed to the fact that the etching rate was excessively high and the etchant did not contain hexafluorosilicic acid and therefore that the difference in the degree of advancement of the etching, which is due to other causes such as the influence of stirring of the etchant, was significant.

Likewise, for piezoelectric element C2, the variation in the length of the piezoelectric bodies in the arrangement direction is large. This can be attributed to the fact that the etchant did not contain hexafluorosilicic acid and therefore that the difference in the degree of advancement of the etching, which is due to other causes such as the influence of stirring of the etchant, was greater than that in Examples.

-continued

| Nitric acid | 6 mass % |
| Water | Rest |

(Etchant B)

| Ammonium fluoride | 4 mass % |
| Nitric acid | 6 mass % |
| Water | Rest |

The piezoelectric segments of the dicing-processed substrate were immersed in etchant A at 28 to 30° C. while etchant A was stirred as described above. Thus, etching-processed substrate A having piezoelectric segments formed in the shape of a 10-μm-wide pillar was obtained by wet etching. The amount of etching was 20 μm and the etching rate was 0.53 μm/min.

Etching-processed substrate B was produced in the same manner as etching-processed substrate A was produced, except that etchant B was used instead of etchant A. The piezoelectric segments in etching-processed substrate B were formed in the shape of a pillar having a width of about 10 µm. In the production of etching-processed substrate B, the amount of etching was 16 µm and the etching rate was 0.66 µm/min.

Figure 9A:
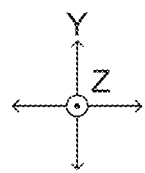
FIG. 9A is a microscope photograph of a processed section in substrate A processed by etching according to an embodiment of the present invention, the photograph being taken by observing the processed section in a plan-view direction at a magnification of 70.
Figure 9A:
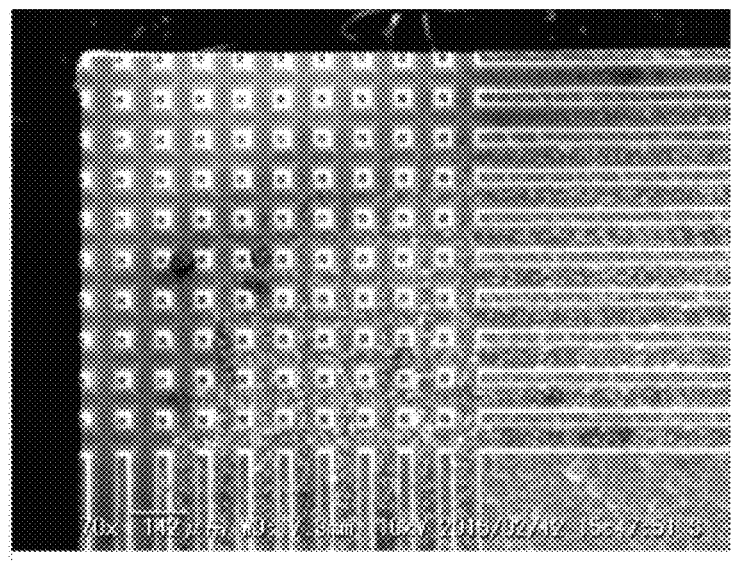
Figure 9B:
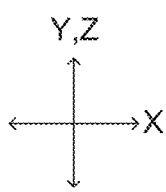
FIG. 9B is a microscope photograph of the processed section observed in an oblique direction at a magnification of 300.
Figure 9B:
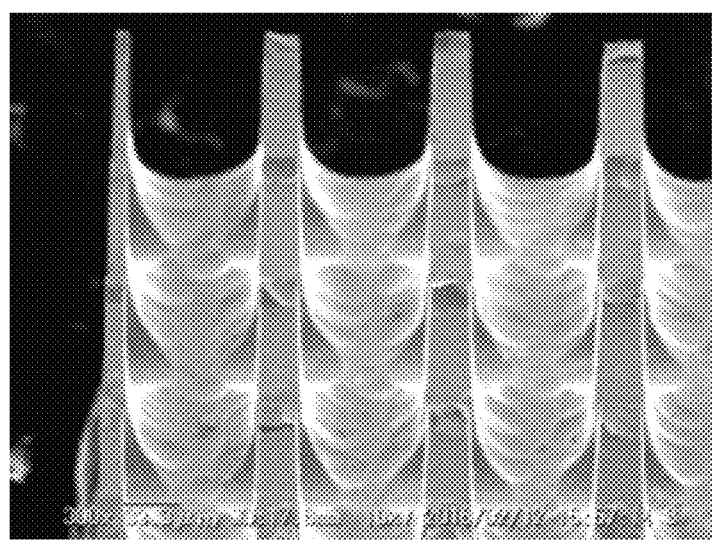
Figure 10A:
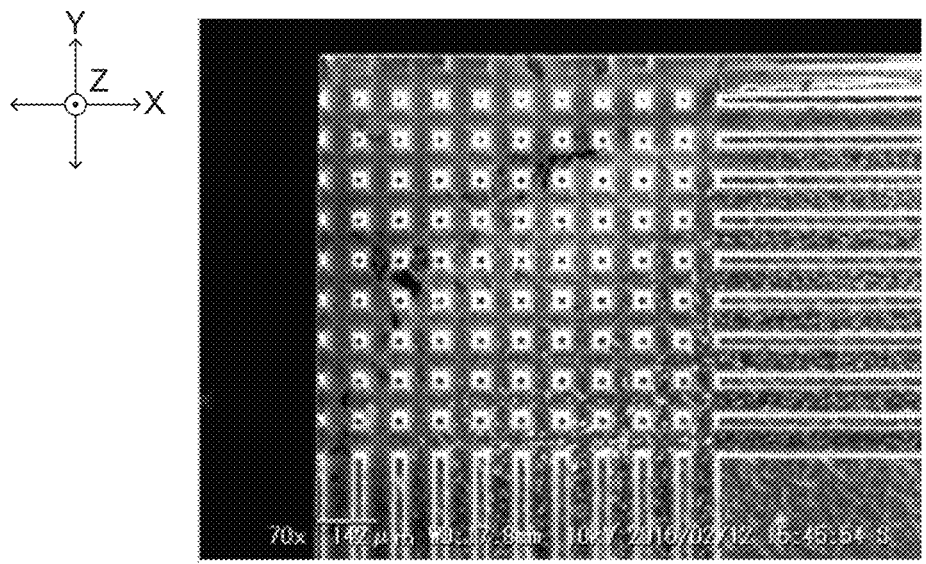
FIG. 10A is a microscope photograph of a processed section in substrate B processed by etching using an etchant containing no hexafluorosilicic acid, the photograph being taken by observing the processed section in a plan-view direction at a magnification of 70.

FIG. 9A is a microscope photograph of the processed section in etching-processed substrate A as observed in a plan-view direction at a magnification of 70, and FIG. 9B is a microscope photograph of the processed section observed in an oblique direction at a magnification of 300. FIG. 10A is a microscope photograph of a processed section in etching-processed substrate B as observed in a plan-view direction at a magnification of 70, and FIG. 10B is a microscope photograph of the processed section observed in an oblique direction at a magnification of 300.

As is apparent from FIG. 9A and FIG. 9B, the diameter (width) of the pillar-shaped piezoelectric segments in etching-processed substrate A is substantially constant from the base ends to top ends of the segments. In particular, as is apparent from FIG. 9A, the diameter is substantially constant for all of the piezoelectric segments located at the center of the PMN-PT substrate and those located at the edge of the PMN-PT substrate. This demonstrates that wet etching with etchant A allows uniform etching of piezoelectric segments.

Figure 10B:
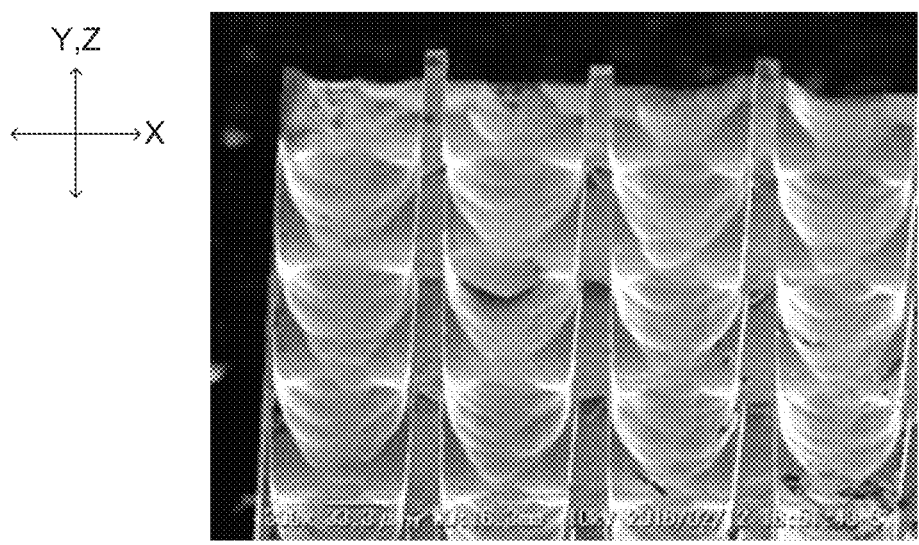
FIG. 10B is a microscope photograph of the processed section observed in an oblique direction at a magnification of 300.

By contrast, as is apparent from FIG. 10A and FIG. 10B, the pillar-shaped piezoelectric segments in etching-processed substrate B are thinner at their top end than at their base end. In addition, the width and height of the piezoelectric segments located at the edge of the PMN-PT substrate are generally smaller than those of the piezoelectric segments located at the center of the substrate. This demonstrates that when piezoelectric segments in a piezoelectric substrate are wet-etched with etchant B, the amount of etching varies in the planar directions of the piezoelectric substrate.

Example 14

A dicing-processed substrate was prepared in the same manner as in the examples previously described. Each piezoelectric segment in this dicing-processed substrate had a length (dimension in the X direction) of 25 mm and a thickness (dimension in the Z direction) 500 µm. As for the width (dimension in the Y direction), the width at the upper surface (on the Z1 side) was about 51 µm and the width at the lower surface (on the Z2 side) was about 50 µm. The width of the cuts formed by dicing (the distance between surfaces of the adjacent piezoelectric segment that face each other in the Y direction) was about 20 µm.

First, 100 mL of etchant 1 and a stir bar were placed in a 100 mL beaker made of PTFE. The temperature etchant 1 was 28° C.

The etching of the dicing-processed substrate was carried out in two stages. In the first etching stage (S1), the piezoelectric segment section of the dicing-processed substrate was placed in etchant 1 in such a manner that the direction of stirring-induced flow of etchant 1 would coincide with the Z direction of the piezoelectric segments, and etchant 1 was stirred at a rotation speed of 100 rpm. The etching time in the first etching stage was 80 minutes.

Next, in the second etching stage (S2), the dicing-processed substrate was placed on the bottom of another glass beaker containing etchant 1 in such a manner that the upper surface (Z1 side) of the dicing-processed substrate was in contact with the bottom of the beaker and that the direction of stirring-induced flow of etchant 1 would coincide with the Y direction of the piezoelectric segments, and etchant 1 was stirred at a rotation speed of 100 rpm. The etching time in the second etching stage was 10 minutes. As a result of such etching, etching-processed substrate 14 having a set of wet-etched piezoelectric segments was obtained.

Next, the piezoelectric segment section of etching-processed substrate 14 thus obtained was immersed and rinsed with a resin emulsion to introduce resin particles into the gaps between the piezoelectric segments. The resin emulsion was prepared by adding 3 mL of a polymer latex particles ("micromer" available from Corefront Corporation) containing 12-µm-diameter spherical polystyrene-based particles dispersed in water to 20 mL of ultrapure water followed by mixing. Etching-processed substrate 14 rinsed with the resin emulsion was placed and dried on a fluorine-coated working substrate.

Next, dried etching-processed substrate 14 on the working substrate was sandwiched by rectangular rod-shaped support members from both sides in the Y direction, and the piezoelectric segments were thus held from both sides in the Y direction. The support members were rectangular rods made of PZT and had a length in the Z direction (height) of 350 µm, which is slightly smaller than that (450 µm) of etching-processed substrate 14.

Next, a two-component epoxy resin (C-1163, available from TESK CO., LTD.) was suppled onto etching-processed substrate 14, and thus the gaps between the piezoelectric segments were filled with the liquid epoxy resin. To remove bubbles from the filling epoxy resin, etching-processed substrate 14 having the gaps filled with the epoxy resin was left in a reduced pressure atmosphere ($10^{-3}$ Pa) for 30 minutes. Subsequently, Kapton tape was attached to the surface of the working substrate, the upper edge of the support members, and the upper surface of etching-processed substrate 14, and the piezoelectric segments were fixed in such a manner that the segments were slightly pressed by the support members in the Y direction. Next, etching-processed substrate 14 was allowed to stand in a 50° C. environment for 20 hours to cure the epoxy resin.

Subsequently, the resulting resin-cured section, in which plate-shaped piezoelectric segments spaced from each other at desired intervals and resinous bodies were alternately arranged, was cut in the Y direction (in which the piezoelectric segments and the resinous bodies were alternately arranged) to have a predetermined length in the X direction (the length direction of the piezoelectric segments). In this manner, piezoelectric composite 14 was obtained having plate-shaped piezoelectric segments spaced from each other at desired intervals and resinous bodies alternately arranged.

Element tilting angle A in piezoelectric composite 14 was determined to be +0.8°. Element tilting angle A was determined as follows: Piezoelectric composite 14 was observed with an optical microscope of KEYENCE CORPORATION from the free end side in the X direction (at a magnification of 300 or more, for example), a number of piezoelectric segments corresponding to 20% of the total number of piezoelectric segments were selected substantially at equal intervals (for example, when the total number of the piezoelectric segment is 100, one piezoelectric segment is selected per five piezoelectric segments so that the intervals between the selected segments are equal), angle α of the central axis of each selected piezoelectric segment with a line perpendicular to the bottom surface of piezoelectric composite 14 was determined, and the average of absolute values of angles α was calculated as element tilting angle A.

As for the positive and negative sings attached to angle A, when the upper surface (Z1-side surface) of the dicing-processed substrate is assumed to be the bottom surface of piezoelectric composite 14 and the central axis as observed from the free end side in the X direction is a diagonally-right-up axis, the positive sign is attached, while when the central axis is a diagonally-right-down axis, the negative sign is attached. That is, angle A is zero for the case where the dicing-induced taper was completely eliminated by the etching (the case where the length on the Z1 side and the length on the Z2 side were equal), angle A is positive for the case where the dicing-induced taper remained, and angle A is negative for the case where the dicing-induced taper was completely eliminated and then a taper opposite in direction to the dicing-induced taper was formed by the etching.

Next, piezoelectric element 14 was produced in the same manner as in Example 1, except that piezoelectric composite 14 was used instead of piezoelectric composite 1.

Figure 11A:
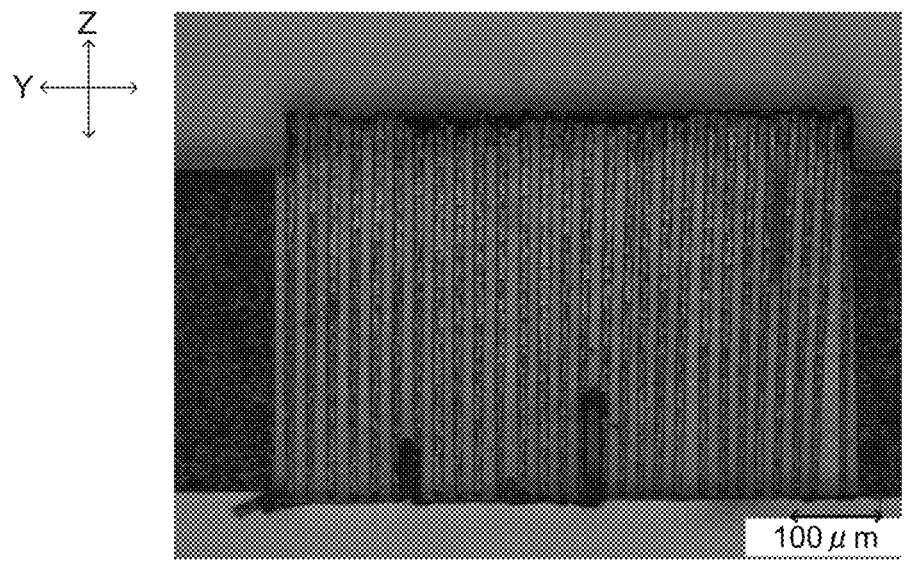
FIG. 11A is a microscope photograph of an array of piezoelectric bodies and resinous bodies in a piezoelectric composite according to Example, the photograph being taken by observing the array in a horizontal direction at a magnification of 400.

Further, as shown in FIG. 11A, the X-direction end surface of piezoelectric element 14 was observed with an optical microscope available from KEYENCE CORPORATION at a magnification of 400, and the width (dimension in the Y direction) of each piezoelectric body and the width of each resinous body in piezoelectric composite 1 were measured. The width of the piezoelectric bodies was 10 µm on average and the width of the resinous bodies was 12 µm on average.

Example 15

Piezoelectric composite 15 and piezoelectric element 15 were produced in the same manner as in Example 14, except that the etching time in the first etching stage was changed to 70 minutes and that the etching time in the second etching stage was changed to 20 minutes. Element tilting angle A in piezoelectric composite 15 was −1.5°.

Example 16

Figure 11B:
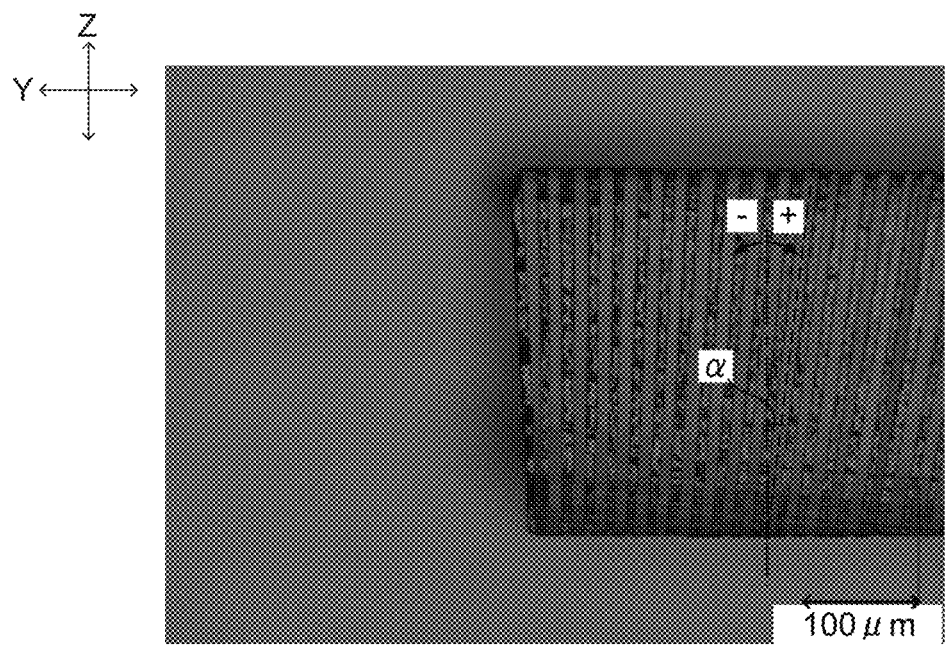
FIG. 11B is a microscope photograph of an array of piezoelectric bodies and resinous bodies in a piezoelectric composite according to Comparative Example, the photograph being taken by observing the array in a horizontal direction at a magnification of 500.

Piezoelectric composite 16 and piezoelectric element 16 were produced in the same manner as in Example 14, except that the etching time in the first etching stage was changed to 90 minutes and that the second etching stage was not performed. As shown in FIG. 11B, the X-direction end surface of piezoelectric composite 16 was observed at a magnification of 500 as in the case of piezoelectric composite 14, and element tilting angle A in piezoelectric composite 16 was determined to be +6.0°.

For Examples 14 to 16, the etching time and element tilting angle are shown in Table 2.

TABLE 2

| | Etching time (minutes) | | Element tilting |
|---|---|---|---|
| | S1 | S2 | (°) |
| Example 14 | 80 | 10 | +0.8 |
| Example 15 | 70 | 20 | −1.5 |
| Example 16 | 90 | 0 | +6.0 |

For both of piezoelectric elements 14 and 15, as is apparent from the above table, the thickness of the piezoelectric bodies in the Y direction in which the piezoelectric bodies and resinous bodies are alternately arranged in the piezoelectric composite is substantially constant. This can be attributed to the fact that in the second etching stage, the concentration of the etchant around the starting points of the tapers of the piezoelectric segments was maintained constant by stirring throughout the etching, while the concentration of the etchant around the extreme ends of the tapers became relatively low due to the etchant being stagnant and the solute in the etchant being exhausted, and therefore that the etching advanced more preferentially around the starting points of the tapers than around the extreme ends of the tapers and in consequence the tapers formed by dicing were substantially eliminated.

In piezoelectric element 16, the absolute value of the element tilting angle is greater than in piezoelectric elements 14 and 15. This can be attributed to the fact that, in the first etching stage, the etching advanced uniformly over the entire surface of the piezoelectric segments and the tapers formed by dicing were not sufficiently eliminated.

The present application claims priority based on Japanese Patent Application No. 2016-100335 filed on May 19, 2016 and Japanese Patent Application No. 2017-009392 filed on Jan. 23, 2017. The entire contents of the specifications and drawings of the earlier patent applications are incorporated herein.

INDUSTRIAL APPLICABILITY

With the above-described method for producing a piezoelectric element having a piezoelectric composite having piezoelectric bodies and resinous bodies alternately arranged, the length (width) of the piezoelectric bodies in the direction in which the piezoelectric bodies and resinous bodies are arranged can be made substantially uniform by etching. Therefore, the production method is expected to offer an increase in the efficiency of production of the piezoelectric composite and a reduction of the decrease in production yield of the piezoelectric composite and allow more widespread use of the piezoelectric element.

REFERENCE SIGNS LIST

1 Piezoelectric substrate
2, 22 Piezoelectric segment
3 Resin particle
4 Epoxy resin
5 Electrode layer
23 First enclosed body
24 First resin plate
25 Second enclosed body
26 Second resin plate
27, 41 Piezoelectric composite
31 Beaker
32 Stir bar
33 Holder
42 Positive electrode section
43 Negative electrode section
44 Backing plate
45 Flexible substrate
46 Dematching layer
51 Substrate
52 Support member
53 Adhesive tape
DB Dicer blade

The invention claimed is:
1. A method for producing a piezoelectric element comprising a piezoelectric composite, the piezoelectric composite having piezoelectric bodies made of a Pb-based piezoelectric material and resinous bodies alternately arranged, the method comprising:
etching a plurality of aligned piezoelectric segments formed by dicing with an etchant, wherein
a liquid containing 0.1 to 20 mass % of hexafluorosilicic acid is used as the etchant; wherein each piezoelectric segment of the plurality of piezoelectric segments has a taper extending in a direction from a first end toward a second end of the piezoelectric segment, the second end being opposite to the first end, and the etching comprises:

a first etching in which the plurality of piezoelectric segments are etched by causing the etchant to flow relative to the piezoelectric segments in such a manner that the concentration of the etchant is constant between first ends and second ends of the piezoelectric segments; and a second etching in which the plurality of piezoelectric segments are etched under a condition where the concentration of the etchant is higher around the first ends than around the second ends of the piezoelectric segments.

2. The method for producing a piezoelectric element according to claim 1, wherein the etchant further contains one or more compounds selected from the group consisting of nitric acid, ammonium fluoride, and sodium fluoride, and the content of each of the compounds in the etchant is 1 to 10mass %.

3. The method for producing a piezoelectric element according to claim 1, wherein an etching rate in the etching is less than 2 μm/min.

4. The method for producing a piezoelectric element according to claim 1, wherein all of the plurality of aligned piezoelectric segments are integrally connected to a piezoelectric base.

5. The method for producing a piezoelectric element according to claim 1, wherein the etched piezoelectric segments have a width of 30 μm or less and a thickness of 80 μm or more.

6. The method for producing a piezoelectric element according to claim 1, wherein in the first etching, the etchant is caused to flow in such a direction that the etchant passes through gaps between the plurality of piezoelectric segments without being blocked by the piezoelectric segments.

7. The method for producing a piezoelectric element according to claim 1, wherein in the second etching, the etchant is caused to flow faster around the first ends in a direction in which the plurality of piezoelectric segments are aligned than around the second ends.

8. The method for producing a piezoelectric element according to claim 1, wherein in the second etching, the plurality of piezoelectric segments are disposed to be in contact with a supporting section on the second ends in the etchant.

9. The method for producing a piezoelectric element according to claim 8, wherein the supporting section is composed of a material dissolvable by the etchant.

10. The method for producing a piezoelectric element according to claim 1, wherein the piezoelectric segments are plate-shaped, and the method further comprises:

adjusting intervals between adjacent ones of the etched piezoelectric segments to constant intervals; and filling gaps between the adjacent piezoelectric segments with a resin after the adjustment of the intervals.

11. The method for producing a piezoelectric element according to claim 1, further comprising:

gap-adjusting intervals between adjacent ones of the plurality of piezoelectric segments etched in the etching;

temporarily fixing each of the plurality of piezoelectric segments with a temporary-fixing member after the adjustment of the intervals in the gap-adjusting; and solidifying in which gaps between adjacent ones of the plurality of temporarily fixed piezoelectric segments are filled with a resin and the resin is solidified to form the piezoelectric composite.

12. The method for producing a piezoelectric element according to claim 11, wherein a substrate, a support member, and an adhesive tape are used as the temporary-fixing member, and the temporary-fixing comprises:

placing the plurality of piezoelectric segments on the substrate;

sandwiching the plurality of piezoelectric segments on the substrate by the support member from both sides in an arrangement direction in which the piezoelectric segments are aligned; and bonding the substrate, the support member, and the plurality of piezoelectric segments sandwiched by the support member, using the adhesive tape in such a manner that the adhesive tape extends between sections of the substrate that are located outside the support member in the arrangement direction.

13. The method for producing a piezoelectric element according to claim 1, further comprising:

polishing a pair of end surfaces of the piezoelectric composite that are opposite to each other in a direction in which the piezoelectric bodies extend; and forming an electrode on each of the polished end surfaces.

* * * * *